(12) United States Patent
Ueda

(10) Patent No.: US 6,861,335 B2
(45) Date of Patent: Mar. 1, 2005

(54) METHOD FOR FABRICATING A SEMICONDUCTOR DEVICE THAT INCLUDES LIGHT BEAM IRRADIATION TO SEPARATE A SEMICONDUCTOR LAYER FROM A SINGLE CRYSTAL SUBSTRATE

(75) Inventor: Tetsuzo Ueda, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 10 days.

(21) Appl. No.: 10/292,928

(22) Filed: Nov. 13, 2002

(65) Prior Publication Data

US 2003/0089906 A1 May 15, 2003

(30) Foreign Application Priority Data

Nov. 13, 2001 (JP) .......................................... 2001-346802
Oct. 22, 2002 (JP) .......................................... 2002-307151

(51) Int. Cl.[7] ............................................. H01L 21/20
(52) U.S. Cl. ........................ 438/458; 438/479; 438/796
(58) Field of Search ................................ 438/458, 478, 438/479, 763, 796

(56) References Cited

U.S. PATENT DOCUMENTS 5,539,206 A * 7/1996 Schimert .................. 250/338.4
5,895,223 A * 4/1999 Peng et al. .................... 438/18
6,071,795 A * 6/2000 Cheung et al. .............. 438/458
6,559,075 B1 * 5/2003 Kelly et al. .................. 438/795
6,596,079 B1 * 7/2003 Vaudo et al. .................. 117/97

FOREIGN PATENT DOCUMENTS

| JP | 20000-91632 A | 3/2000 |
|---|---|---|
| JP | 2001-501778 | 2/2001 |
| WO | WO 98/14986 | 4/1998 |

* cited by examiner

Primary Examiner—Stephen W. Smoot
(74) Attorney, Agent, or Firm—McDermott Will & Emery LLP

(57) ABSTRACT

A spacer layer is formed on a single-crystal substrate and an epitaxially grown layer composed of a group III–V compound semiconductor layer containing a nitride or the like is further formed on the spacer layer. The epitaxially grown layer is adhered to a recipient substrate. The back surface of the single-crystal substrate is irradiated with a light beam such as a laser beam or a bright line spectrum from a mercury vapor lamp such that the epitaxially grown layer and the single-crystal substrate are separated from each other. Since the forbidden band of the spacer layer is smaller than that of the single-crystal substrate, it is possible to separate the thin semiconductor layer from the substrate by decomposing or fusing the spacer layer, while suppressing the occurrence of a crystal defect or a crack in the epitaxially grown layer.

12 Claims, 19 Drawing Sheets

Laser Beam (hv)

Laser Beam (hν)

Energy of Laser Beam or Bright Line
Spectrum from Mercury Vapor Lamp

Laser Beam (hν)

Laser Beam (hν)

Crystal Defect

Laser Beam (hv)

Laser Beam (hν)

METHOD FOR FABRICATING A SEMICONDUCTOR DEVICE THAT INCLUDES LIGHT BEAM IRRADIATION TO SEPARATE A SEMICONDUCTOR LAYER FROM A SINGLE CRYSTAL SUBSTRATE

BACKGROUND OF THE INVENTION

The present invention relates to a method for fabricating a semiconductor device for use as, e.g., a short-wavelength light-emitting diode, a short-wavelength semiconductor laser, or a high-temperature and high-speed transistor.

A nitride semiconductor which has a large optical band gap (e.g., GaN has an optical band gap of about 3.4 eV at a room temperature) has been conventionally used as a material for implementing a visible light-emitting diode which emits light in a relatively short wavelength region such as green, blue, or white light or a short-wavelength semiconductor laser which would be used for future high density optical disks. In particular, a nitride semiconductor has been used prevalently for the active layer of a light-emitting diode. As a light source for a read/write operation to a high-density optical disk, the commercialization of a blue or blue-purple laser has been in strong demand.

It is general practice to form each of nitride semiconductor layers composing a device on a sapphire substrate having a principal surface substantially coincident with the (0001) plane by typical metal organic chemical vapor deposition. In the case of fabricating a semiconductor laser, it is necessary to form cleavage planes serving as mirrors of the cavity at the edge portions of the semiconductor laser structure of the nitride semiconductor layers with a waveguide structure and electrodes. However, it has been difficult to cleave the entire substrate since the crystal structure of the sapphire substrate has rotated by 30° from that of the nitride semiconductor in the c plane ((0001) surface)) and sapphire is hard to be cleaved. This has prevented the formation of satisfactory resonator surfaces (mirrors) and made it difficult to achieve a high performance semiconductor laser, especially with a low threshold current.

To solve the problem, there has been proposed a method of epitaxially growing nitride semiconductor layers, adhering the nitride semiconductor layers to a recipient substrate made of a material that allows successful formation of cleavage planes of the nitride semiconductor layers thereon, separating the nitride semiconductor layers and the sapphire substrate from each other, and thereby cleaving the nitride semiconductor layers or the recipient substrate. In accordance with the method, the separation of the nitride semiconductor layers and the sapphire substrate is accomplished by irradiation of a laser beam from the back surface of the sapphire substrate and thereby decomposing or fusing a GaN layer and the like present at the interface with the sapphire substrate. The method uses, e.g., an Si (001) substrate as a recipient substrate. By bringing the cleavage plane of Si and the cleavage plane of GaN into parallel relation upon adhesion, the nitride semiconductor layers can be formed with two flat resonator surfaces parallel to each other. This allows such a high performance semiconductor laser with a lower threshold current and a longer lifetime.

A description will be given to a method for fabricating the aforementioned nitride semiconductor device. FIGS. 16A to 16D are cross-sectional view illustrating the conventional method for fabricating a nitride semiconductor device.

First, in the step shown in FIG. 16A, an epitaxially grown layer 103 having a multilayer structure including a GaN layer, an AlGaN layer, and an InGaN layer and having a pn junction portion is formed by, e.g., metal organic chemical vapor deposition (MOCVD) on a sapphire substrate 101 (wafer). In the case of fabricating a semiconductor laser, a waveguide structure has been incorporated into the epitaxially grown layer 103 by using a regrowth technique, selective etching of the epitaxial layer, or the like.

Next, in the step shown in FIG. 16B the epitaxially grown layer 103 is adhered to an Si substrate 104 having a principal surface substantially coincident with the (001) plane. In the step shown in FIG. 16C, the back surface of the sapphire substrate 101 is irradiated with a KrF excimer laser beam (at a wavelength of 248 nm).

FIG. 17 is an energy band diagram showing band states in the sapphire substrate 101 and in the GaN layer included in the nitride semiconductor layers. Since the band gap (optical band gap) of the sapphire substrate 101 is large, as shown in the drawing, the output of the KrF excimer laser beam is not absorbed by the sapphire substrate 101. Because the band gap (optical band gap) of the GaN layer is small, the laser beam used for irradiation is absorbed by the GaN layer so that, if the power of the laser is extremely high, the energy of the laser beam is consumed to break chemical bonds so that the bonds in the GaN layer are broken in the vicinity of the interface with the sapphire substrate 101.

Consequently, the sapphire substrate 101 and the epitaxially grown layer 103 are separated from each other, as shown in FIG. 16D. Thereafter, the process of forming an electrode which comes in contact with the epitaxially grown layer 103 on the Si substrate 104, cleaving the substrate (in the case of fabricating the semiconductor laser), and the like is performed. In the case of fabricating the semiconductor laser, the epitaxially grown layer 103 and the Si substrate 104 are adhered to each other such that the <11-20> direction of the GaN layer and the <110> direction of the Si substrate are in parallel relation for easy cleavage.

The foregoing fabrication method allows formation of flat resonator surfaces of the semiconductor laser. Since the nitride semiconductor layers are adhered to the Si substrate with superior heat dissipation, the semiconductor laser is expected to have a longer lifetime.

However, the foregoing method for fabricating a nitride semiconductor device has the following problems.

In the step shown in FIG. 16C, the irradiation with the KrF excimer laser beam increases the probability of a crystal defect or a crack occurring in the region of the GaN layer adjacent the interface between the epitaxially grown layer 103 and the sapphire substrate 101. This narrows down an optimum range in which the power of the KrF excimer laser. If the epitaxially grown layer is as thin as about 4 μm, a crystal defect and a crack extend the surface of the epitaxially grown layer so that it is necessary to form the nitride semiconductor layers (epitaxially grown layer) having a total film thickness as large as about, e.g., 10 μm. If the nitride semiconductor layers on the sapphire substrate are increased in film thickness, however, the bowing of the entire wafer during cooling after epitaxial growth becomes conspicuous due to the different thermal expansion coefficients of the sapphire substrate and the nitride semiconductor layers so that it is difficult to adhere the flat recipient substrate to the wafer.

SUMMARY OF THE INVENTION

It is therefore an object of the present invention to provide a method for fabricating a semiconductor device having a very thin epitaxially grown laser separated from the substrate for the epitaxial growth containing a reduced number of crystal defects.

A first method for fabricating a semiconductor device according to the present invention is a method for fabricating a semiconductor device having a semiconductor layer formed by epitaxial growth from a single-crystal substrate, the method comprising the steps of: (a) forming a spacer layer having an optical band gap smaller than an optical band gap of a lowermost portion of the semiconductor layer such that an upper surface of the single-crystal substrate is covered with the spacer layer; (b) forming the semiconductor layer on the spacer layer; and (c) irradiating the spacer layer with a light beam having an energy smaller than an optical band gap of the single-crystal substrate and larger than the optical band gap of the spacer layer through a back surface of the single-crystal substrate to separate the semiconductor layer from the single-crystal substrate.

Since the method irradiates the spacer layer with the light beam in the step (c) with the spacer layer smaller in optical band gap width than the single-crystal substrate being interposed between the single-crystal substrate and the semiconductor layer, the energy of the light beam is primarily absorbed by the spacer layer. As a result, the portion of the spacer layer adjacent the interface with the single-crystal substrate is mainly decomposed or fused so that the single-crystal substrate and the semiconductor layer are separated from each other. This allows the separation of the semiconductor layer as thin as, e.g., 5 $\mu$m or less from the substrate at a low light power density without causing a crystal defect or a crack in the semiconductor layer.

The step (b) can include forming a compound semiconductor layer containing nitrogen as the semiconductor layer.

The step (b) can include forming a group III–V compound semiconductor layer as the semiconductor layer.

The step (a) includes forming a ZnO layer as the spacer layer and the step (b) includes composing the lowermost portion of the semiconductor layer of a group III–V compound material containing nitrogen and having an optical band gap larger than an optical band gap of the ZnO layer. The arrangement allows easy separation of the semiconductor layer and the single-crystal substrate from each other by using the relatively small optical band gap of the ZnO layer. Since the light beam used for the irradiation is absorbed primarily by the ZnO layer, the semiconductor layer as thin as, e.g., 5 $\mu$m or less can be separated from the substrate at a low light power density without causing a crystal defect or a crack in the semiconductor layer.

The step (a) includes forming, as the spacer layer, a group III–V compound semiconductor layer containing nitrogen and the step (b) includes composing the lowermost portion of the semiconductor layer of a group III–V compound semiconductor layer containing nitrogen and having an optical band gap larger than the optical band gap of the spacer layer. The arrangement allows easy separation of the semiconductor layer and the single-crystal substrate from each other by using the relatively small optical band gap of the spacer layer. Since the light beam used for the irradiation is absorbed primarily by the spacer layer, the semiconductor layer as thin as, e.g., 5 $\mu$m or less can be separated from the substrate at a low light power density without causing a crystal defect or a crack in the semiconductor layer.

The step (a) can include forming an $In_xGa_{1-x}N$ layer ($0<x\leq 1$) as the spacer layer and the step (b) can include composing the lowermost portion of the semiconductor layer of an $Al_yGa_{1-y}N$ layer ($0<y\leq 1$).

The step (a) includes forming a GaN layer as the spacer layer and the step (b) includes composing the lowermost portion of the semiconductor layer of an $Al_yGa_{1-y}N$ layer ($0<y\leq 1$). This achieves a reduction in the thickness of the semiconductor layer.

Preferably, the step (a) includes forming a GaN layer as the spacer layer and the step (b) includes adjusting a thickness of the semiconductor layer to a range not less than 0.5 $\mu$m and less than 4 $\mu$m.

The first method further comprises, after the step (a) and prior to the step (b), the step of: forming, on the spacer layer, a multilayer portion composed of a plurality of thin films stacked in layers to have gradually varying compositions, wherein the step (b) includes forming the semiconductor layer on the multilayer portion. Even if a crystal defect or a crack is caused by the light beam used for the irradiation, the arrangement prevents the crystal defect or crack in the multilayer portion from extending from the multilayer portion to the semiconductor layer so that the semiconductor layer has an excellent crystalline property.

The multilayer portion is a multiple quantum well layer composed of alternately stacked quantum well layers and barrier layers. The arrangement allows the formation of a high-performance device using the multiple quantum well layer.

The step (b) includes the substeps of: (b1) forming a plurality of covering portions covering the spacer layer in mutually spaced apart relation; and (b2) forming the semiconductor layer such that the spacer layer and the plurality of covering portions are covered with the semiconductor layer. The arrangement allows the formation of a semiconductor layer with an excellent crystalline property by using a smaller number of crystal defects and cracks contained in the portion of the semiconductor layer growing laterally along the upper surfaces of the covering portions.

In that case, the substep (b2) can include the steps of prior to the substep (b1), forming, in a part of the semiconductor layer covering the spacer layer, the plurality of covering portions in mutually spaced apart relation; and after the substep (b1), forming a remaining part of the semiconductor layer through a space between the covering portions.

The substep (b2) includes forming the covering portions composed of a multilayer insulating film or a metal film. In addition to achieving the foregoing effects, the arrangement allows the light beam to focus on the interface between the spacer layer and the single-crystal substrate so that the occurrence of a single crystal or a crack in the semiconductor layer is suppressed.

The substep (b2) includes forming the covering portions composed of a material lower in thermal conductivity than the spacer layer. In addition to achieving the foregoing effects, the arrangement allows the heat to focus on the interface between the spacer layer and the single-crystal substrate so that the occurrence of a single crystal or a crack in the semiconductor layer is suppressed.

The step (c) includes performing the irradiation with the light beam having an energy smaller than the optical band gap of the lowermost portion of the semiconductor layer. The arrangement allows the separation of the semiconductor layer and the single-crystal substrate through the decomposition or fusion of the spacer layer, while more positively circumventing the decomposition or fusion of the semiconductor layer.

The first method further comprises, prior to the step (a), the step of: forming, on the single-crystal substrate, a buffer layer having an optical band gap larger than the energy of the light beam used for the irradiation in the step (c) such that the buffer layer reduces distortion resulting from a lattice mismatch between the spacer layer and the single-crystal substrate in the step (c), wherein the step (a) includes forming the spacer layer on the buffer layer. The arrangement most positively prevents the occurrence of a defect in the spacer layer. As a result, a semiconductor layer with an excellent crystalline property is obtained.

The step of forming the buffer layer includes forming, as the buffer layer, an AlN buffer layer having a thickness in the range of 0.5 μm to 2 μm. The arrangement allows the formation of a semiconductor layer with a remarkably excellent crystalline property.

If the first method further comprises, prior to the step (a), the step of: forming, on the single-crystal substrate, an AlN buffer layer having a thickness of 0.5 μm or more, the step (a) preferably includes forming an $In_xGa_{1-x}N$ layer ($0<x\leq1$) or a GaN layer as the spacer layer and the step (b) preferably includes forming the semiconductor layer on the spacer layer such that the lowermost portion of the semiconductor layer is composed of an $Al_yGa_{1-y}N$ layer ($0<y\leq1$).

The step (c) includes performing the irradiation with the light beam from a laser oscillating pulsatively. The arrangement increases the output power of the light beam, which rapidly decomposes or fuses the spacer layer and allows the semiconductor layer to be separated from the substrate.

The step (c) includes irradiating the back surface of the single-crystal substrate with a bright line spectrum from a mercury vapor lamp. The arrangement allows, e.g., a group III–V compound semiconductor layer containing nitrogen and having an optical band gap larger than the energy of a bright spectrum line at 365 nm and a group III–V compound semiconductor layer containing nitrogen and having an optical band gap smaller than the energy of the bright spectrum line at 365 nm to be formed by varying the compositions of films. As a result, it becomes possible to form the spacer layer and the semiconductor layer from the group III–V compound semiconductor layers containing nitrogen.

The step (c) includes heating the single-crystal substrate. The arrangement reduces a stress caused in a film by the different thermal expansion coefficients during cooling down after the formation of the spacer layer and facilitates the separation of the semiconductor layer formed on the single-crystal substrate having a large area therefrom.

Preferably, a temperature to which the single-crystal substrate is heated in the step (c) is in the range of 400° C. to 750° C.

The step (c) includes performing the irradiation with the light beam such that an optical flux from a light source scans the entire surface of the single-crystal substrate. The arrangement facilitates the separation of the semiconductor layer formed on the single-crystal substrate having a large area therefrom.

Preferably, a substrate selected from a sapphire substrate, an SiC substrate, an MgO substrate, an $LiGaO_2$ substrate, an $LiGa_xAl_{1-x}O_2$ ($0\leq x\leq1$) mixed crystal substrate, and an $LiAlO_2$ substrate is used as the single-crystal substrate. The use of the sapphire substrate improves the initial growth of a group III–V compound and allows a group III–V semiconductor layer containing nitrogen and having an excellent crystalline property to be formed thereon. The use of the SiC substrate, the MgO substrate, the $LiGaO_2$ substrate, or the $LiGa_xAl_{1-x}O_2$ mixed crystal substrate brings the lattice constant of the single-crystal substrate closer to that of the group III–V compound semiconductor layer and allows the semiconductor layer composed of a group III–V compound, containing nitrogen, and having an excellent crystalline property to be formed thereon.

The first method may further comprise, after the step (b) and prior to the step (c), the step of fixing, onto the semiconductor layer, a recipient substrate composed of a material different from a material composing the semiconductor layer, wherein the step (c) includes transferring the semiconductor layer from the single-crystal substrate to the recipient substrate. Alternatively, the first method can further comprise, after the step (c), the step of: fixing, onto the semiconductor layer, a recipient substrate composed of a material different from a material composing the semiconductor layer and transferring the semiconductor layer from the single-crystal substrate to the recipient substrate. In either case, the arrangement allows the separation of the semiconductor layer that has been fixed to the recipient substrate from the single-crystal substrate. Accordingly, it becomes possible to adjust the respective crystal orientations of the recipient substrate and the semiconductor layer such that the respective cleavage planes of the recipient substrate and the semiconductor layer are positioned in a common plane. Even if the cleavage plane of the single-crystal substrate is not coincident with that of the semiconductor layer grown epitaxially thereon or if the single-crystal substrate is composed of a material difficult to cleave, the edge portions thereof can be formed with flat cleavage planes by selectively using a material which can be cleaved simultaneously with the semiconductor layer to compose the recipient substrate. If the semiconductor device is, e.g., a semiconductor laser, therefore, a high-light-output semiconductor laser using the flat cleavage planes as the mirror surfaces of the cavity is obtained.

A substrate selected from an Si substrate, a GaAs substrate, a GaP substrate, and an InP substrate is used as the recipient substrate. This allows easy formation of excellent cleavage planes.

A second method for fabricating a semiconductor device according to the present invention comprises the steps of: (a) forming an AlN buffer layer having a thickness of 0.5 μm or more on an single-crystal substrate; (b) forming a semiconductor layer covering the AlN buffer layer and having a lowermost portion composed of an $Al_yGa_{1-y}N$ layer ($0\leq y\leq1$); and (c) irradiating the semiconductor layer with a light beam having an energy smaller than an optical band gap of the AlN buffer layer and larger than an optical band gap of the lowermost portion of the semiconductor layer through a back surface of the single-crystal layer to separate the semiconductor layer from the single-crystal substrate.

The method allows the formation of a semiconductor layer with a remarkably excellent crystalline property on the AlN buffer layer.

A third method for fabricating a semiconductor device according to the present invention is a method for fabricating a semiconductor device having a semiconductor layer formed by epitaxial growth from a single-crystal substrate, the method comprising the steps of: (a) forming a multilayer portion for preventing extension of a defect such that an upper surface of the single-crystal substrate is covered therewith, the multilayer portion being composed of a plurality of thin films stacked in layers to have gradually varying compositions; and (b) forming the semiconductor layer on the multilayer portion.

In accordance with the method, even if an initially grown layer in contact with a bulk single-crystal substrate or with a single-crystal substrate contains a large number of crystal defects and cracks, the crystal defects and cracks are prevented from extending from the single-crystal substrate to the semiconductor layer so that a semiconductor layer with an excellent crystalline property is obtained.

The step (a) includes forming the multilayer portion by alternately stacking in layers two thin films having different compositions. The arrangement more positively achieves the effect of preventing the crystal defects and cracks contained in the single-crystal substrate from extending therefrom to the semiconductor layer.

The step (a) includes forming the multilayer portion having a multiple quantum well structure in which the plurality of thin films are quantum well layers and barrier layers. The arrangement allows the formation of a high-performance semiconductor device using a multiple quantum well structure.

The step (a) includes doping either the quantum well layers or the barrier layers with a dopant at such a high concentration as to allow carriers to spread out upon application of an ON voltage. The arrangement provides a low-resistance semiconductor layer free from cracks and a high-performance semiconductor device. If the semiconductor layer is transferred to the recipient substrate after the step (b) to be provided on the active region of a laser light-emitting device, the resistance of the multilayer portion is low relative to a supply of carriers to the active region so that the light output of the semiconductor laser is increased.

A semiconductor device according to the present invention comprises: a substrate; a semiconductor layer provided on the substrate and including an active layer serving as a light-emitting region; and a multiple quantum well layer provided on the semiconductor layer and composed of quantum well layers and barrier layers which are alternately stacked.

In the arrangement, the multiple quantum well layer is provided on the semiconductor layer serving as the active region of the laser light-emitting device so that a high-performance laser device using the multiple quantum well layer is obtained.

Either the quantum well layers or the barrier layers contain a dopant at such a high concentration as to allow carriers to spread out upon application of an ON voltage. In the arrangement, the light output of the semiconductor laser can be increased by using the resistance of the multiple quantum well layer which is low relative to the supply of carriers to the active region.

DETAILED DESCRIPTION OF THE INVENTION

Embodiment 1

FIGS. 1A to 1D are cross-sectional views illustrating a method for fabricating a semiconductor device according to a first embodiment of the present invention.

Figure 1A:
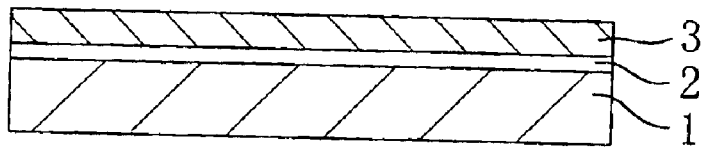
FIGS. 1A to 1D are cross-sectional views illustrating a method for fabricating a semiconductor device according to a first embodiment of the present invention.

First, in the step shown in FIG. 1A, a sapphire substrate 1 (wafer) having a principal surface substantially coincident with the (0001) plane (c plane) is prepared. Then, a ZnO layer 2 having a thickness of about 100 nm and serving as a spacer layer is formed by, e.g., RF sputtering on the sapphire substrate 1. Subsequently, an epitaxially grown layer 3 (with a thickness of 5 μm) having a multilayer structure including a GaN layer, an AlGaN layer, and an InGaN layer, each of which is of p-type, of n-type, or undoped, is formed on the ZnO layer 2 by metal organic chemical vapor deposition (MOCVD). In the case of fabricating a semiconductor laser, a waveguide structure has been incorporated into the epitaxially grown layer 3 by using a regrowth technique, selective etching or the like.

Figure 1B:
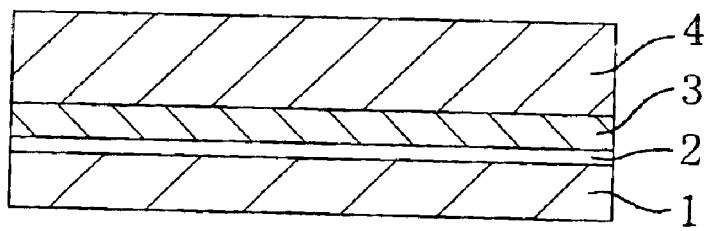
Figure 1C:
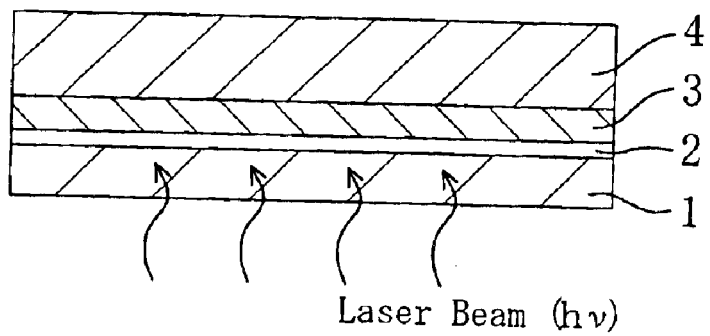

Next, in the step shown in FIG. 1B, the epitaxially grown layer 3 is adhered to an Si substrate 4 (recipient substrate) having a principal surface substantially coincident with the (001) plane. In the step shown in FIG. 1C, the back surface of the sapphire substrate 1 is irradiated with a KrF excimer laser beam (at a wavelength of 248 nm corresponding to an energy of 5 eV), whereby the epitaxially grown layer 3 and the sapphire substrate 1 are separated from each other. The irradiation is performed such that the beam (luminous flux) of the laser scans the entire surface of the wafer. The entire wafer has been heated to about 500° C. such that an in-film stress resulting from the different thermal expansion coefficients of the sapphire substrate 1, the ZnO layer 2, and the epitaxially grown layer 3 are reduced. The heating temperature is preferably in the range of 400° C. to 750° C. in terms of performing the stress reducing function without inducing the degradation of the properties of the individual layers on the substrate and the significant deformation thereof.

In the case of fabricating the semiconductor laser, the epitaxially grown layer 3 and the Si substrate 4 are adhered to each other such that the <11-20> direction of the GaN layer and the <110> direction of the Si substrate are in parallel relation for easy cleavage.

Figure 1D:
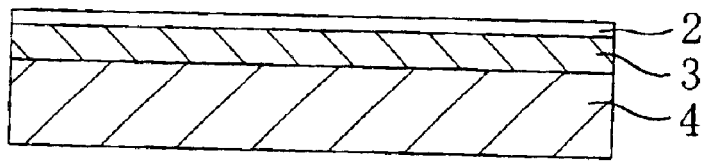

Consequently, the sapphire substrate 1 and the epitaxially grown layer 3 are separated from each other, as shown in FIG. 1D. Thereafter, the process of forming an electrode which comes in contact with the epitaxially grown layer 3 on the Si substrate 4, cleaving the substrate (in the case of fabricating the semiconductor laser), and the like is performed.

Figure 2:
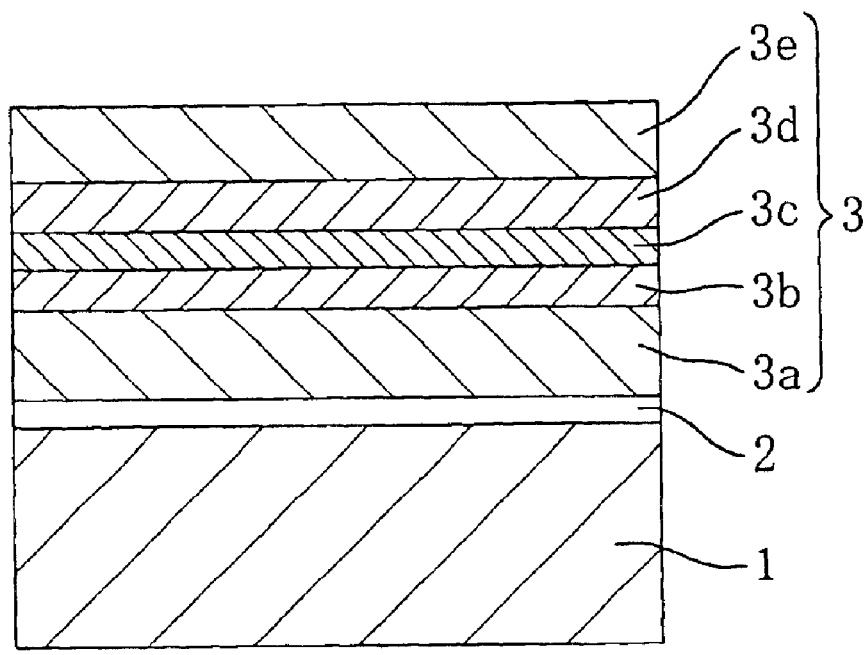
FIG. 2 is a cross-sectional view showing an example of a multilayer structure formed in the step shown in FIG. 1A.

FIG. 2 is a cross-sectional view showing an example of a multilayer structure formed in the step shown in FIG. 1A. In this example, a structure of a semiconductor laser is shown and the epitaxially grown layer 3 has an n-GaN layer 3a with a thickness of about 3 $\mu$m, an n-$Al_{0.05}Ga_{0.95}N$ layer 3b with a thickness of about 100 nm, a double-well light-emitting region 3c composed of three $In_{0.05}Ga_{0.95}N$ layers each having a thickness of 6 nm and three $In_{0.1}Ga_{0.9}N$ layers each having a thickness of about 3 nm which are alternately stacked, a p-$Al_{0.05}Ga_{0.95}N$ layer 3d with a thickness of about 300 nm, and a p-GaN layer 3e with a thickness of about 400 nm.

Figure 3:
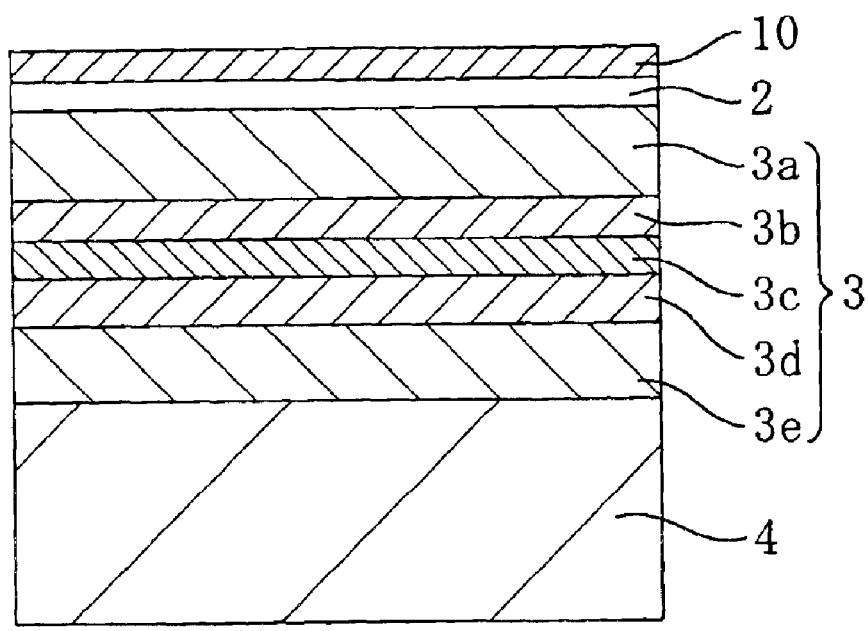
FIG. 3 is a view showing an example of a multilayer structure formed in the step shown in FIG. 1D.

FIG. 3 shows an example of a multilayer structure formed in the step shown in FIG. 1D. As shown in FIG. 3, the epitaxially grown layer 3 shown in FIG. 2 is mounted in vertically inverted relation on the Si substrate 4. An electrode 10 for n-type conductivity composed of, e.g., Ti/Al is further formed on the epitaxially grown layer 3.

It is to be noted that the epitaxially grown layer 3 according to the present invention is not limited to the structures shown in FIGS. 2 and 3. The present invention is also applicable to a light-emitting diode having another structure, a semiconductor laser having another structure, or a semiconductor device other than a semiconductor laser and having another structure such as a MESFET (Metal Semiconductor Field Effect Transistor), a HEMT, or a Schottky diode.

Figure 4:
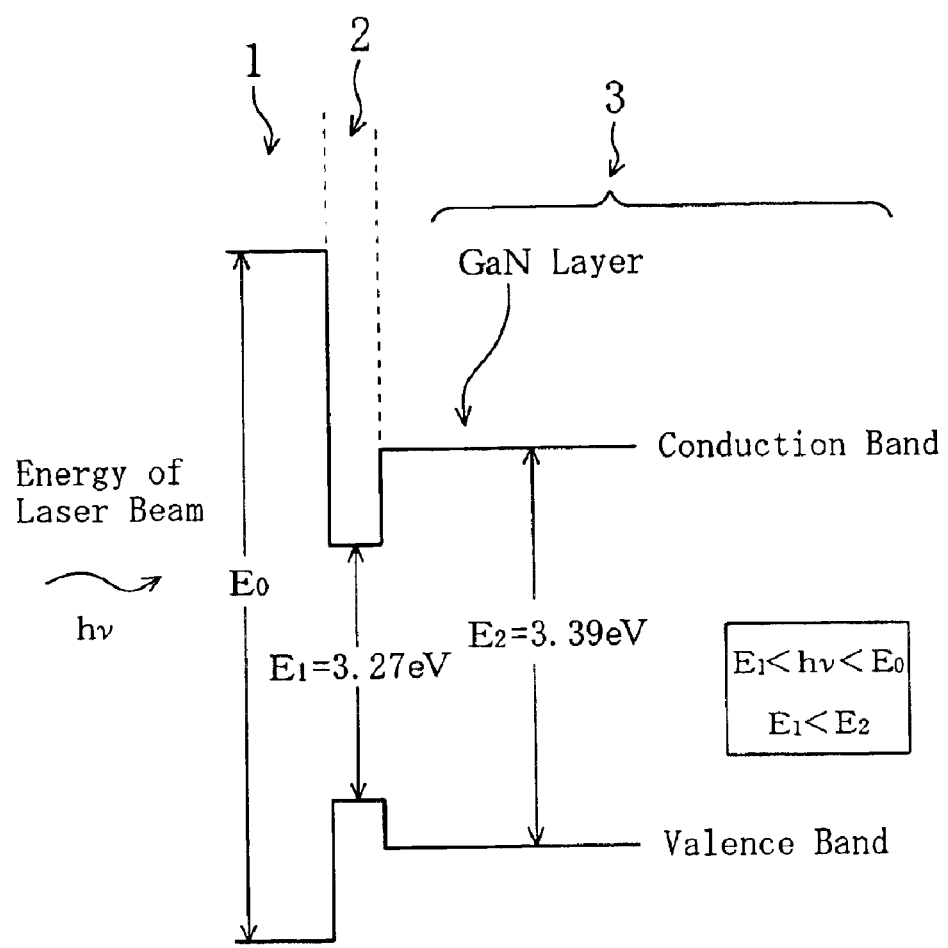
FIG. 4 is an energy band diagram showing respective band structures in a sapphire substrate, a ZnO layer, and a GaN layer included in an epitaxially grown layer according to the first embodiment.

FIG. 4 is an energy band diagram showing respective band structures in the sapphire substrate 1, the ZnO layer 2 serving as the spacer layer, and the GaN layer included in the epitaxially grown layer 3 according to the present embodiment. As shown in the drawing, the band gap (optical band gap) of the ZnO layer 2 is 3.27 eV, which is smaller than the band gap (3.39 eV) of the GaN layer.

In the present embodiment, the laser beam used to irradiate the back surface of the wafer is primarily absorbed by the ZnO layer 2 so that only a small portion thereof reaches the epitaxially grown layer 3. Consequently, the decomposition or fusion of the crystal occurs in the entire ZnO layer 2 or in the region of the ZnO layer 2 adjacent the interface with the sapphire substrate 1. This allows the epitaxially grown layer 3 and the sapphire substrate 1 to be separated from each other at a low light power density. Since the epitaxially grown layer 3 is hardly fused, the occurrence of a crystal defect or a crack in the epitaxially grown layer 3 during the laser irradiation can be suppressed. Even if the thickness of the epitaxially grown layer 3 is reduced to 5 $\mu$m or less, therefore, the epitaxially grown layer 3 and the sapphire substrate 1 can be separated from each other, while the epitaxially grown layer 3 retains its excellent crystalline property. Since the epitaxially grown layer 3 is as thin as about 5 $\mu$m, it is possible to reduce the bowing of the substrate resulting from the different thermal expansion coefficients of the epitaxially grown layer 3 and the sapphire substrate 1 during the cooling of the substrate after the epitaxial growth. This allows easy, uniform, and highly reproducible adhesion to the flat Si substrate 4 performed by using, e.g., metal.

Figure 16A:
FIGS. 16A to 16D illustrate a conventional method for fabricating a semiconductor device.
Figure 16B:
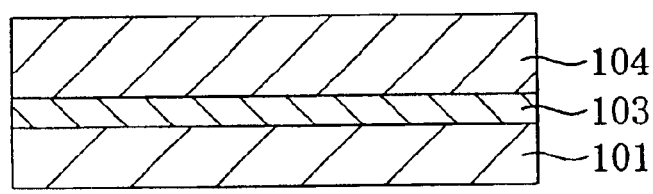
Figure 16C:
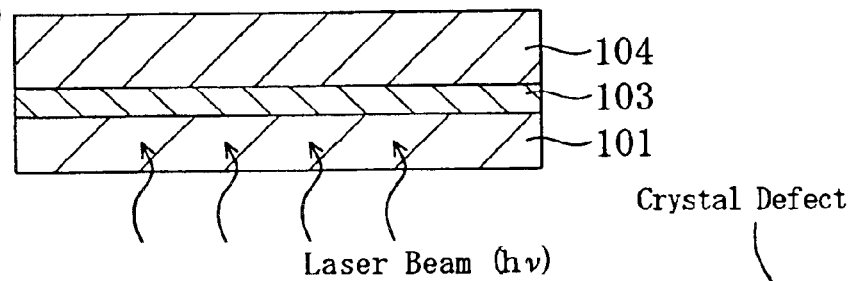
Figure 16D:
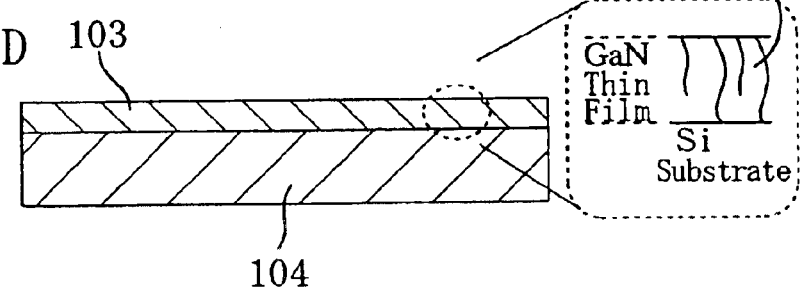

The low light power density indicates a light power having a value smaller than a threshold power density of about 200 mJ/$cm^2$ at which, when the third harmonic of, e.g., a YAG laser is used, a GaN layer in direct contact with a sapphire substrate as in a conventional nitride semiconductor device (see FIG. 16C) is separated therefrom.

The time at which the Si substrate 4 is adhered to the epitaxially grown layer 3 may be prior to the irradiation with the laser beam, as in the present embodiment, or after the separation of the sapphire substrate 1 with the irradiation with the laser beam.

Embodiment 2

FIGS. 5A to 5D are cross-sectional views illustrating a method for fabricating a semiconductor device according to a second embodiment of the present invention.

Figure 5A:
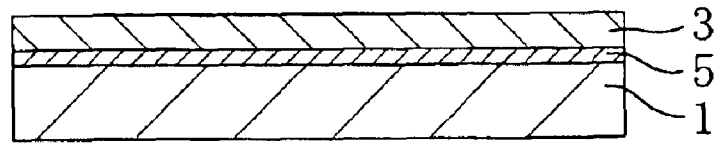
FIGS. 5A to 5D are cross-sectional views illustrating a method for fabricating a semiconductor device according to a second embodiment of the present invention.

First, in the step shown in FIG. 5A, a sapphire substrate 1 (wafer) having a principal surface substantially coincident with the (0001) plane (c plane) is prepared. Then, an $In_{0.1}Ga_{0.9}N$ layer 5 having a thickness of about 30 nm and serving as a spacer layer is formed by, e.g., MOCVD on the sapphire substrate 1. Subsequently, an epitaxially grown layer 3 (with a thickness of 5 $\mu$m) having a multilayer structure including a GaN layer, an AlGaN layer, and an InGaN layer, each of which is of p-type, of n-type, or undoped, is formed on the $In_{0.1}Ga_{0.9}N$ layer 5 by MOCVD performed in the same apparatus. In the case of fabricating a semiconductor laser, a waveguide structure has been incorporated into the epitaxial layer 3 by using a regrowth technique, selective etching or the like.

Figure 5B:
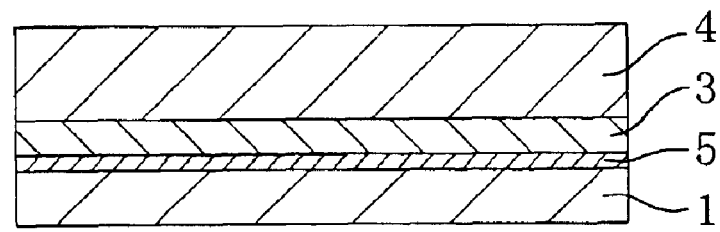
Figure 5C:
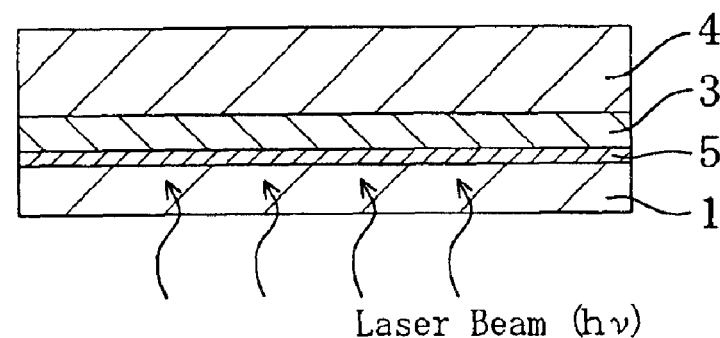

Next, in the step shown in FIG. 5B, the epitaxially grown layer 3 is adhered to an Si substrate 4 (recipient substrate) having a principal surface substantially coincident with the (001) plane. In the step shown in FIG. 5C, the back surface of the sapphire substrate 1 is irradiated with a KrF excimer laser beam (at a wavelength of 248 nm corresponding to an energy of 5 eV), whereby the epitaxially grown layer 3 and the sapphire substrate 1 are separated from each other. The irradiation is performed such that the beam (luminous flux) of the laser scans the entire surface of the wafer. The entire wafer has been heated to about 500° C. such that an in-film stress resulting from the different thermal expansion coefficients of the sapphire substrate 1, the $In_{0.1}Ga_{0.9}N$ layer 5, and the epitaxially grown layer 3 are reduced. The heating temperature is preferably in the range of 400° C. to 750° C. in terms of performing the stress reducing function without inducing the degradation of the properties of the individual layers on the substrate and the significant deformation thereof.

In the case of fabricating the semiconductor laser, the epitaxially grown layer 3 and the Si substrate 4 are adhered to each other such that the <11-20> direction of the GaN layer and the <110> direction of the Si substrate are in parallel relation for easy cleavage.

The time at which the Si substrate 4 is adhered to the epitaxially grown layer 3 may be prior to the irradiation with the laser beam, as in the present embodiment, or after the separation of the sapphire substrate 1 with the irradiation with the laser beam.

Figure 5D:
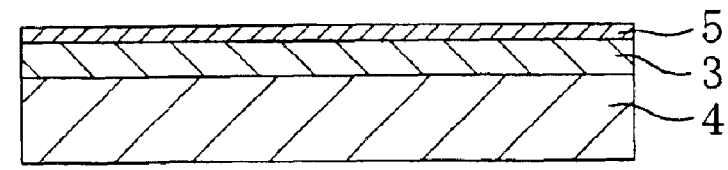

Consequently, the sapphire substrate 1 and the epitaxially grown layer 3 are separated from each other, as shown in FIG. 5D. Thereafter, the process of forming an electrode which comes in contact with the epitaxially grown layer 3 on the Si substrate 4, cleaving the substrate (in the case of fabricating the semiconductor laser), and the like is performed.

In the present embodiment, a structure provided with the $In_{0.1}Ga_{0.9}N$ layer 5 in place of the ZnO layer 2 of the structure shown in, e.g., each of FIGS. 2 and 3 is obtained in each of the steps shown in FIGS. 5A and 5D.

Figure 6:
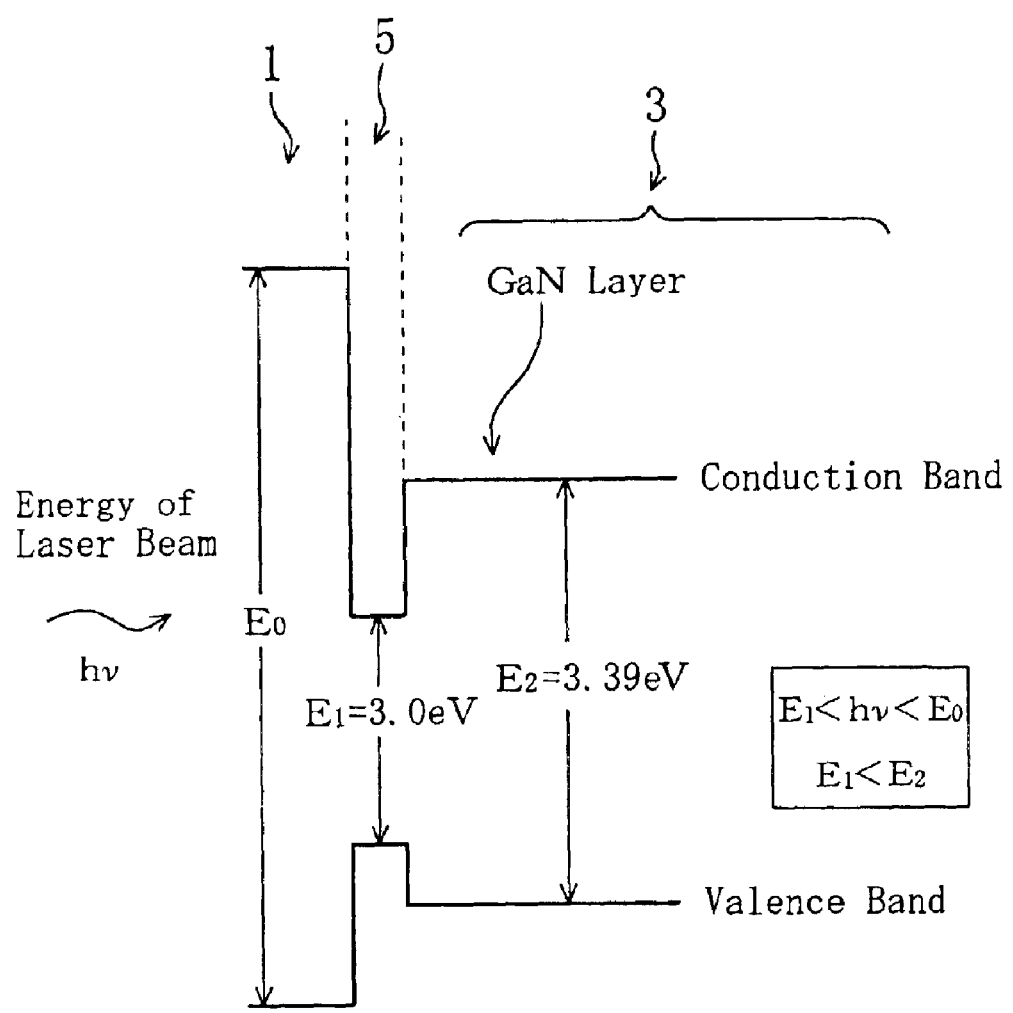
FIG. 6 is an energy band diagram showing respective band structures in a sapphire substrate, an $In_{0.1}Ga_{0.9}N$ layer, and a GaN layer included in an epitaxially grown layer according to the second embodiment.

FIG. 6 is an energy band diagram showing respective band structures in the sapphire substrate 1, the $In_{0.1}Ga_{0.9}N$ layer 5, and the GaN layer included in the epitaxially grown layer 3 according to the present embodiment. As shown in the drawing, the band gap (optical band gap) of the $In_{0.1}Ga_{0.9}N$ layer 5 is 3.0 eV, which is smaller than the band gap (3.39 eV) of the GaN layer.

Thus, the structure according to the present embodiment is obtained by replacing the ZnO layer 2 (spacer layer) according to the first embodiment with the $In_{0.1}Ga_{0.9}N$ layer 5 and the laser beam used to irradiate the back surface of the wafer is primarily absorbed by the $In_{0.1}Ga_{0.9}N$ layer 5 so that only a small portion thereof reaches the epitaxially grown layer 3. Consequently, the decomposition or fusion of the crystal occurs in the entire $In_{0.1}Ga_{0.9}N$ layer 5 or in the region of the $In_{0.1}Ga_{0.9}N$ layer 5 adjacent the interface with the sapphire substrate 1. This allows the epitaxially grown layer 3 and the sapphire substrate 1 to be separated from each other at a low light power density. Since the epitaxially grown layer 3 is hardly fused, the occurrence of a crystal defect or a crack in the epitaxially grown layer 3 during the laser irradiation can be suppressed. Even if the thickness of the epitaxially grown layer 3 is reduced to 5 µm or less, therefore, the epitaxially grown layer 3 and the sapphire substrate 1 can be separated from each other, while the epitaxially grown layer 3 retains its excellent crystalline property Since the thickness of the epitaxially grown layer 3 is as thin as about 5 µm, it is possible to reduce the bowing of the substrate resulting from the different thermal expansion coefficients of the epitaxially grown layer 3 and the sapphire substrate 1 during the cooling of the substrate after epitaxial growth. This allows easy, uniform, and highly reproducible adhesion to the flat Si substrate performed by using, e.g., metal. That is, the same effects as achieved by the first embodiment are achievable.

Since the band gap of the $In_{0.1}Ga_{0.9}N$ layer 5 is narrower than the band gap of the ZnO layer 2 according to the present embodiment, the present embodiment performs separation at a temperature or a laser power density lower than in the first embodiment and more effectively suppresses the occurrence of a crystal defect, the bowing of the substrate, and the like.

Embodiment 3

FIGS. 7A to 7D are cross-sectional views illustrating a method for fabricating a semiconductor device according to a third embodiment of the present invention.

Figure 7A:
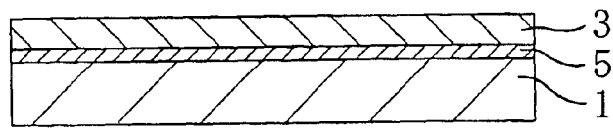
FIGS. 7A to 7D are cross-sectional views illustrating a method for fabricating a semiconductor device according to a third embodiment of the present invention.

First, in the step shown in FIG. 7A, a sapphire substrate 1 (wafer) having a principal surface substantially coincident with the (0001) plane (c plane) is prepared. Then, an $In_{0.1}Ga_{0.9}N$ layer 5 having a thickness of about 30 nm and serving as a spacer layer is formed by, e.g., MOCVD on the sapphire substrate 1. Subsequently, an epitaxially grown layer 3 (with a thickness of 5 µm) having a multilayer structure including a GaN layer, an AlGaN layer, and an InGaN layer, each of which is of p-type, of n-type, or undoped, is formed on the $In_{0.1}Ga_{0.9}N$ layer 5 by MOCVD performed in the same apparatus. In the present embodiment, an $Al_{0.1}Ga_{0.9}N$ layer is formed in direct contact with the $In_{0.1}Ga_{0.9}N$ layer 5. In the case of fabricating a semiconductor laser, a waveguide structure has been incorporated into the epitaxial layer 3 by using a regrowth technique or the like.

Figure 7B:
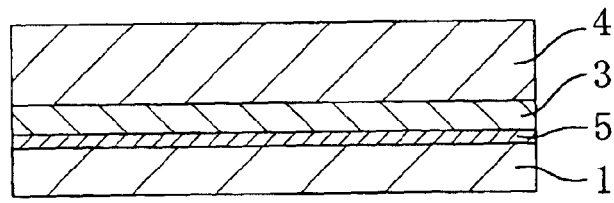
Figure 7C:
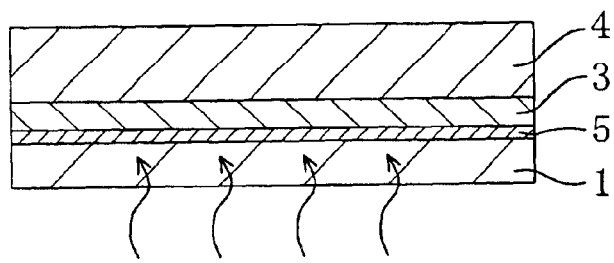

Next, in the step shown in FIG. 7B, the epitaxially grown layer 3 is adhered to an Si substrate 4 (recipient substrate) having a principal surface substantially coincident with the (001) plane. In the step shown in FIG. 7C, to the back surface of the sapphire substrate 1 is irradiated with the third harmonic (at a wavelength of 355 nm corresponding to an energy of 3.49 eV) of a YAG laser or a bright line spectrum (at a wavelength of 365 nm corresponding to an energy of 3.39 eV) from a low-pressure mercury vapor lamp, whereby the epitaxially grown layer 3 and the sapphire substrate 1 are separated from each other. The irradiation is performed such that the beam (luminous flux) of the laser or the bright line spectrum from the low-pressure mercury vapor lamp scans the entire surface of the wafer. The entire wafer has been heated to about 500° C. such that an in-film stress resulting from the different thermal expansion coefficients of the sapphire substrate 1, the $In_{0.1}Ga_{0.9}N$ layer 5, and the epitaxially grown layer 3 are reduced. The heating temperature is preferably in the range of 400° C. to 750° C. in terms of performing the stress reducing function without inducing the degradation of the properties of the individual layers on the substrate and the significant deformation thereof.

In the case of fabricating the semiconductor laser, the epitaxially grown layer 3 and the Si substrate 4 are adhered to each other such that the <11-20> direction of the GaN layer and the <110> direction of the Si substrate are in parallel relation for easy cleavage.

The time at which the Si substrate 4 is adhered to the epitaxially grown layer 3 may be prior to the irradiation with the laser beam, as in the present embodiment, or after the separation of the sapphire substrate 1 with the irradiation with the laser beam.

Figure 7D:
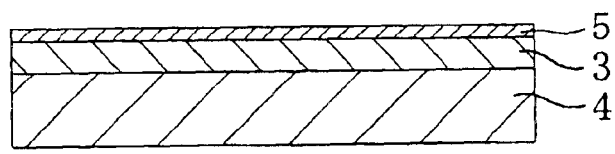

Consequently, the sapphire substrate 1 and the epitaxially grown layer 3 are separated from each other, as shown in FIG. 7D. Thereafter, the process of forming an electrode which comes in contact with the epitaxially grown layer 3 on the Si substrate 4, cleaving the substrate (in the case of fabricating the semiconductor laser), and the like is performed.

In the present embodiment, a structure provided with the $In_{0.1}Ga_{0.9}N$ layer 5 in place of the ZnO layer 2 of the structure shown in, e.g., each of FIGS. 2 and 3 is obtained in the steps shown in FIGS. 7A and 7D.

Figure 8:
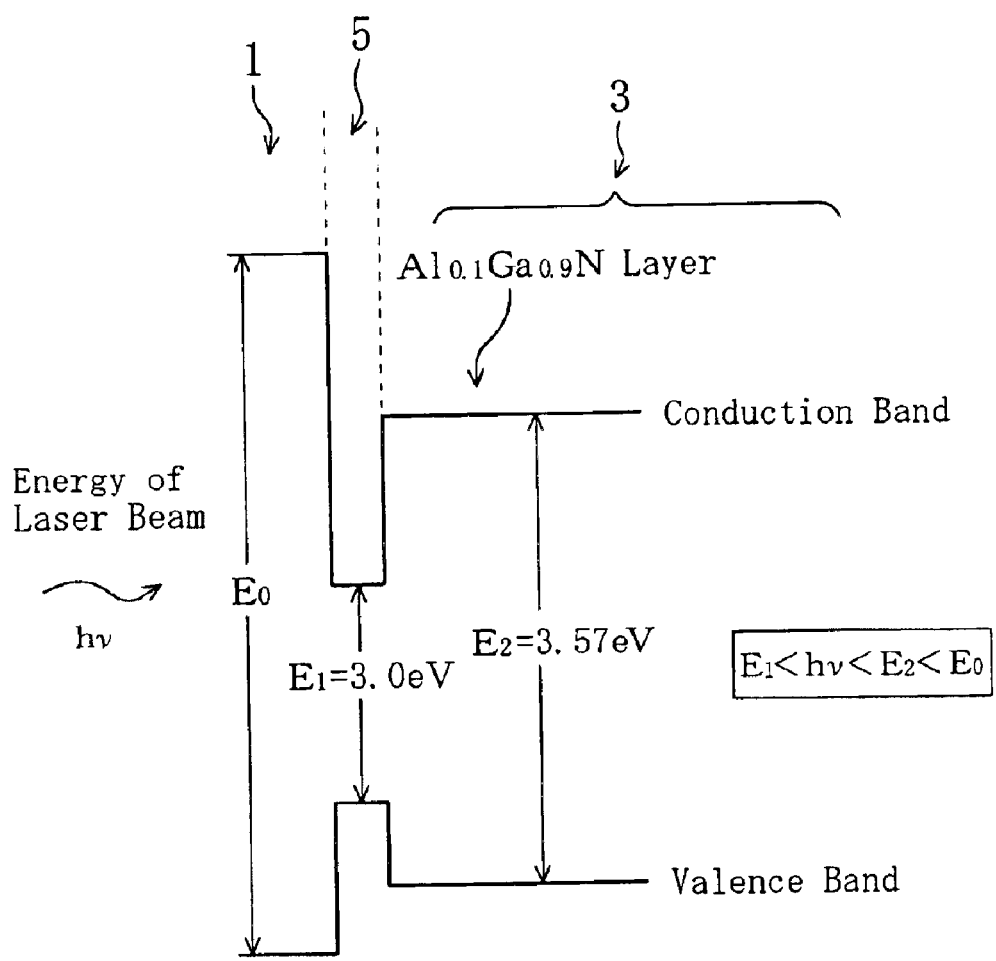
FIG. 8 is an energy band diagram showing respective band structures in a sapphire substrate, an $In_{0.1}Ga_{0.9}N$ layer, and an $Al_{0.1}Ga_{0.9}N$ layer included in an epitaxially grown layer according to the third embodiment.

FIG. 8 is an energy band diagram showing respective band structures in the sapphire substrate 1, the $In_{0.1}Ga_{0.9}N$ layer 5, and the GaN layer in the epitaxially grown layer 3 according to the present embodiment. As shown in the drawing, the band gap E1 (optical band gap) of the $In_{0.1}Ga_{0.9}N$ layer 5 is 3.0 eV, which is smaller than the band gap (3.57 eV) of the $Al_{0.1}Ga_{0.9}N$ layer, while the band gap E2 of the $Al_{0.1}Ga_{0.9}N$ layer is smaller than the band gap E0 of the sapphire substrate 1. In the present embodiment, the energy h ν of the laser beam used for the separation is higher than the band gap E1 of the $In_{0.1}Ga_{0.9}N$ layer 5 and lower than the band gap E2 of the $Al_{0.1}Ga_{0.9}N$ layer.

Thus, the structure according to the present embodiment is obtained by replacing the ZnO layer 2 according to the first embodiment with the $In_{0.1}Ga_{0.9}N$ layer 5 and the laser beam used to irradiate the back surface of the wafer is primarily absorbed by the $In_{0.1}Ga_{0.9}N$ layer 5 so that only a small portion thereof reaches the epitaxially grown layer 3. Consequently, the decomposition or fusion of the crystal occurs in the entire $In_{0.1}Ga_{0.9}N$ layer 5 or in the region of the $In_{0.1}Ga_{0.9}N$ layer 5 adjacent the interface with the sapphire substrate 1. This allows the epitaxially grown layer 3 and the sapphire substrate 1 to be separated from each other at a low light power density. Since the epitaxially grown layer 3 is hardly fused, the occurrence of a crystal defect or a crack in the epitaxially grown layer 3 can be suppressed. Even if the thickness of the epitaxially grown layer 3 is reduced to 5 μm or less, therefore, the epitaxially grown layer 3 and the sapphire substrate 1 can be separated from each other, while the epitaxially grown layer 3 retains its excellent crystalline property.

Since the thickness of the epitaxially grown layer 3 is as thin as about 5 μm, it is possible to reduce the bowing of the substrate resulting from the different thermal expansion coefficients of the epitaxially grown layer 3 and the sapphire substrate 1 during the cooling of the substrate after epitaxial growth. This allows easy, uniform, and highly reproducible adhesion to the flat Si substrate 4 performed by using, e.g., metal. That is, the same effects as achieved by the first and second embodiments are achievable.

Since the band gap difference (0.57 eV) between the $In_{0.1}Ga_{0.9}N$ layer 5 and the $Al_{0.1}Ga_{0.9}N$ layer is larger than the band gap difference (0.12 eV) between the ZnO layer 2 and the GaN layer in the first embodiment and the band gap difference (0.39 eV) between the $In_{0.1}Ga_{0.9}N$ layer 5 and the GaN layer in the second embodiment, the present embodiment more effectively suppresses the occurrence of a crystal defect, the bowing of the substrate, and the like than the first and second embodiments.

If the third harmonic (at a wavelength of 355 nm) of the YAG laser is used, in particular, the laser beam is absorbed by the $In_{0.1}Ga_{0.9}N$ layer 5 but is hardly absorbed by the $Al_{0.1}Ga_{0.9}N$ layer forming the lowermost portion of the epitaxially grown layer so that only the region of the $In_{0.1}Ga_{0.9}N$ layer 5 adjacent the interface with the sapphire substrate 1 is decomposed or fused more effectively.

Variation

Figure 18:
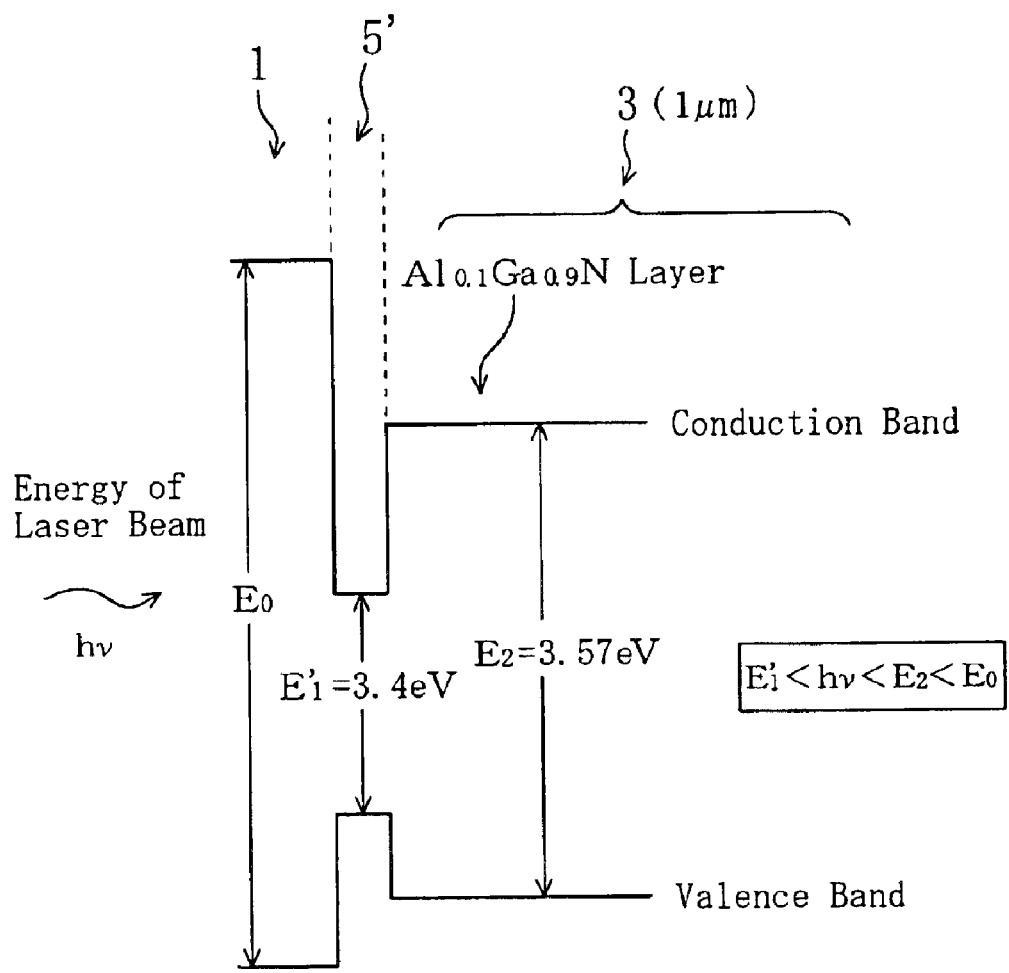
FIG. 18 is an energy band diagram showing respective band structures in a sapphire substrate, an epitaxially grown layer, and the like according to a variation of the third embodiment.

FIG. 18 is an energy band diagram showing respective band structures in a sapphire substrate, an epitaxially grown layer, and the like according to a variation of the third embodiment.

In the present variation, a GaN layer 5' with a thickness of 0.3 μm is used in place of the $In_{0.1}Ga_{0.9}N$ layer 5. The basic structure of the epitaxially grown layer 3 is a multi-layer structure including a GaN layer, an AlGaN layer, and an InGaN layer, each of which is of p-type, of n-type, or undoped, and having a thickness of 1 μm in the same manner as in the third embodiment. In the present variation, an $Al_{0.1}Ga_{0.9}N$ layer is formed in direct contact with the GaN' layer 5'.

In the present variation, the band gap E1' (optical band gap) of the GaN layer 5' is 3.4 eV, which is smaller than the band gap E2 (3.57 eV) of the $Al_{0.1}Ga_{0.9}N$ layer, while the band gap E2 of the $Al_{0.1}Ga_{0.9}N$ layer is smaller than the band gap E0 of the sapphire substrate 1. In the present variation also, the energy h ν of the laser beam used for the separation is larger than the band gap E1' of the GaN layer 5' and smaller than the band gap E2 of the $Al_{0.1}Ga_{0.9}N$ layer. Accordingly, the present variation can achieve the same effects as achieved by the third embodiment.

Figure 17:
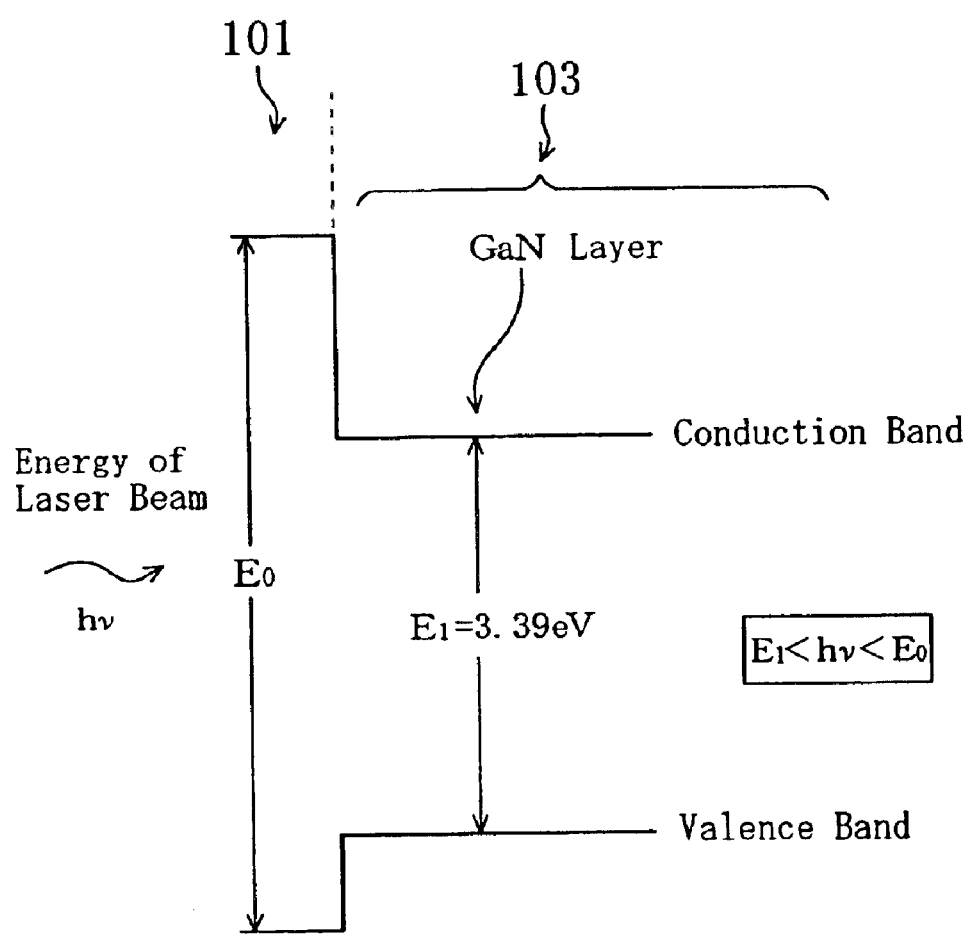
FIG. 17 is a diagram showing a diaphragm in the optical band gap of each of layers in the conventional semiconductor device.

In addition to the effects achieved by the third embodiment, the present variation can also achieve the following effects. As shown in FIG. 17, the conventional semiconductor device having the single GaN layer provided on the sapphire substrate 101 had a problem that a lower limit to the total thickness of the entire epitaxially grown layer 103 was 4 μm by any means and, if the thickness of the epitaxially grown layer 103 was further reduced, a crack or peeling-off is developed. This may be because air generated in the lower end portion of the epitaxially grown layer or a stress released therein gives an impact.

By contrast, the present variation can reduce the total thickness (which is 1.3 μm in the present variation even if the GaN' layer 5' is regarded as a part of the epitaxially grown layer) of the epitaxially grown layer 3 to a value smaller than 4 μm. Consequently, the bowing of the entire wafer resulting from the different thermal expansion coefficients of the sapphire substrate and the epitaxially grown layer (nitride semiconductor layer) can be suppressed so that a flat recipient substrate is adhered to the wafer. If a light-emitting diode, a semiconductor layer, or a high-temperature and high-speed transistor is formed by using such a thinned epitaxially grown layer, the reduced thickness of the epitaxially grown layer allows a device with an improved property, such as a reduced DC series resistance, to be obtained.

Embodiment 4

FIGS. 9A to 9D are cross-sectional views illustrating a method for fabricating a semiconductor device according to a fourth embodiment of the present invention.

Figure 9A:
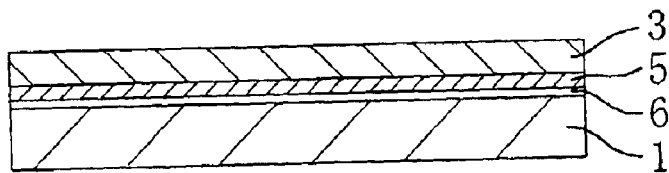
FIGS. 9A to 9D are cross-sectional views illustrating a method for fabricating a semiconductor device according to a fourth embodiment of the present invention.

First, in the step shown in FIG. 9A, a sapphire substrate 1 (wafer) having a principal surface substantially coincident with the (0001) plane (c plane) is prepared. Then, an AlN buffer layer 6 with a thickness of about 30 nm is formed on the sapphire substrate 1 by MOCVD at a low temperature of about 500° C. and an $In_{0.1}Ga_{0.9}N$ layer 5 having a thickness of about 30 nm and serving as a spacer layer is further formed on the AlN buffer layer 6 by MOCVD. Subsequently, an epitaxially grown layer 3 (with a thickness of 5 μm) having a multilayer structure including a GaN layer, an AlGaN layer, and an InGaN layer, each of which is of p-type, of n-type, or undoped, is formed on the $In_{0.1}Ga_{0.9}N$ layer 5 by MOCVD performed in the same deposition system. In the present embodiment, the GaN layer included in the epitaxially grown layer 3 is formed in direct contact with the $In_{0.1}Ga_{0.9}N$ layer 5. In the case of fabricating a semiconductor laser, a waveguide structure has been incorporated into the epitaxial layer 3 by using a regrowth technique, selective etching or the like.

Figure 9B:
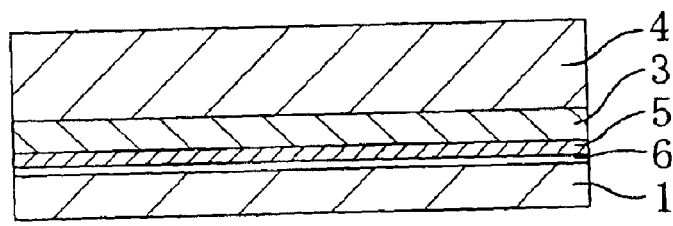
Figure 9C:
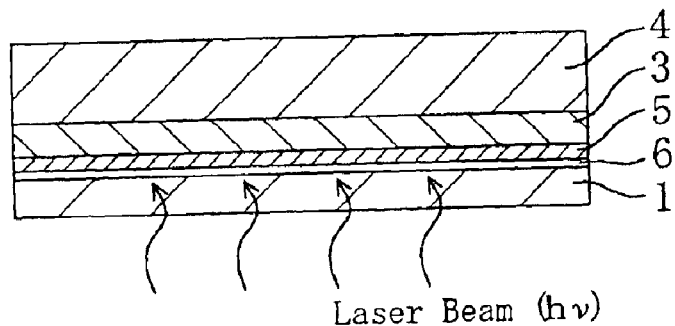

Next, in the step shown in FIG. 9B, the epitaxially grown layer 3 is adhered to an Si substrate 4 (recipient substrate) having a principal surface substantially coincident with the (001) plane. In the step shown in FIG. 9C, the back surface of the sapphire substrate 1 is irradiated with a KrF excimer laser beam (at a wavelength of 248 nm corresponding to an energy of 5 eV), whereby the epitaxially grown layer 3 and the sapphire substrate 1 are separated from each other. The irradiation is performed such that the beam (luminous flux) of the laser scans the entire surface of the wafer. The entire wafer has been heated to about 500° C. such that an in-film stress resulting from the different thermal expansion coefficients of the sapphire substrate 1, the $In_{0.1}Ga_{0.9}N$ layer 5, and the epitaxially grown layer 3 are reduced. The heating temperature is preferably in the range of 400° C. to 750° C. in terms of performing the stress reducing function without inducing the degradation of the properties of the individual layers on the substrate and the significant deformation thereof.

In the case of fabricating the semiconductor laser, the epitaxially grown layer 3 and the Si substrate 4 are adhered to each other such that the <11-20> direction of the GaN layer and the <110> direction of the Si substrate are in parallel relation for easy cleavage.

The time at which the Si substrate 4 is adhered to the epitaxially grown layer 3 may be prior to the irradiation with the laser beam, as in the present embodiment, or after the separation of the sapphire substrate 1 with the irradiation with the laser beam.

Figure 9D:
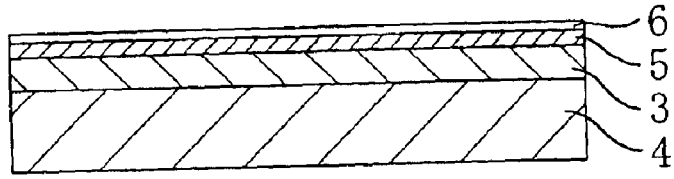

Consequently, the sapphire substrate 1 and the epitaxially grown layer 3 are separated from each other, as shown in FIG. 9D. Thereafter, the process of forming an electrode which comes in contact with the epitaxially grown layer 3 on the Si substrate 4, cleaving the substrate (in the case of fabricating the semiconductor laser), and the like is performed.

In the present embodiment, a structure in which the AlN buffer layer 6 is provided on the sapphire substrate 1 and the $In_{0.1}Ga_{0.9}N$ layer 5 is provided in place of the ZnO layer 2 of the structure shown in, e.g., each of FIGS. 2 and 3 is obtained in the steps shown in FIGS. 9A and 9D.

Figure 10:
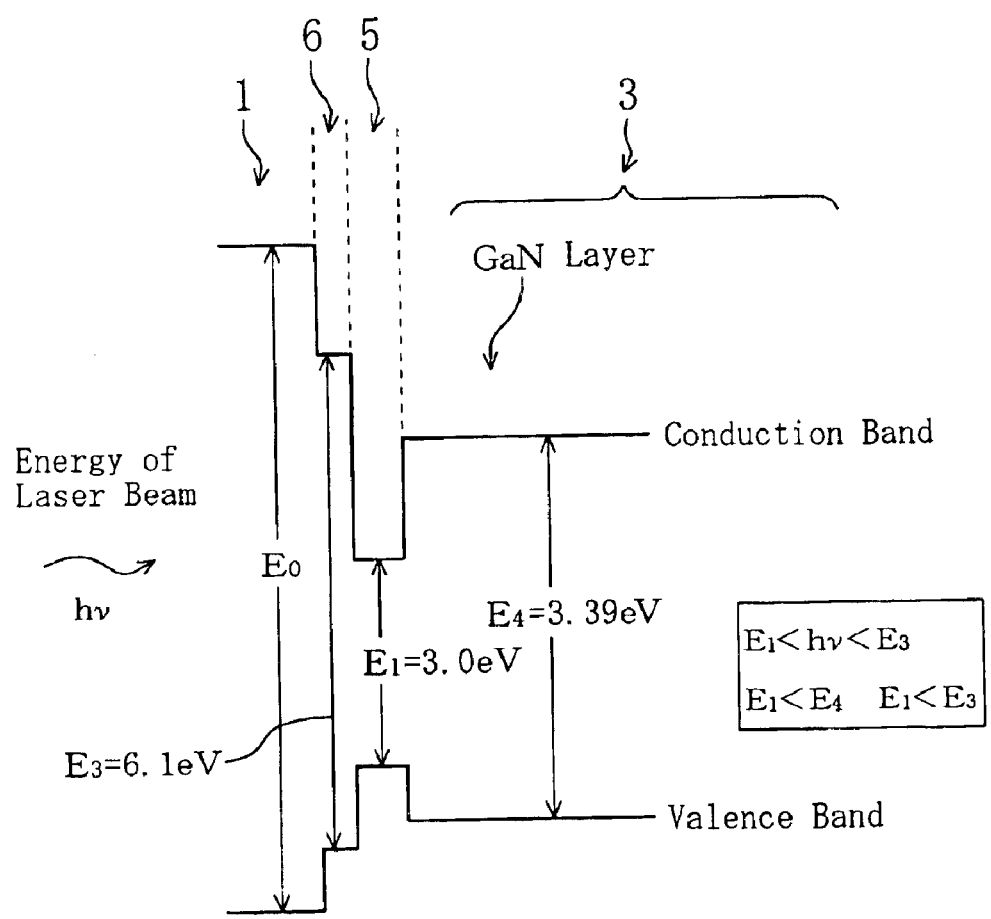
FIG. 10 is an energy band diagram showing respective band structures in a sapphire substrate, an AlN buffer layer, an $In_{0.1}Ga_{0.9}N$ layer, and a GaN layer included in an epitaxially grown layer according to the fourth embodiment.

FIG. 10 is an energy band diagram showing respective band structures in the sapphire substrate 1, the AlN buffer layer 6, the $In_{0.1}Ga_{0.9}N$ layer 5, and the GaN layer included in the epitaxially grown layer 3 according to the present embodiment. As shown in the drawing, the band gap E1 (optical band gap) of the $In_{0.1}Ga_{0.9}N$ layer 5 is 3.0 eV, which is smaller than the band gap E4 (3.39 eV) of the GaN layer and the band gap E3 (6.1 eV) of the AlN buffer layer 6. The energy h v of the laser beam used for peeling is larger than the band gap E1 of the $In_{0.1}Ga_{0.9}N$ layer 5 and smaller than the band gap E3 (6.1 eV) of the AlN buffer layer 6.

Thus, the structure according to the present embodiment is obtained by replacing the ZnO layer 2 according to the first embodiment with the $In_{0.1}Ga_{0.9}N$ layer 5 and the laser beam used to irradiate the back surface of the wafer is primarily absorbed by the $In_{0.1}Ga_{0.9}N$ layer 5 so that only a small portion thereof reaches the epitaxially grown layer 3. Consequently, the decomposition or fusion of the crystal occurs in the entire $In_{0.1}Ga_{0.9}N$ layer 5 or in the region of the $In_{0.1}Ga_{0.9}N$ layer 5 adjacent the interface with the sapphire substrate 1. This allows the epitaxially grown layer 3 and the sapphire substrate 1 to be separated from each other at a low light power density. Since the epitaxially grown layer 3 is hardly fused, the occurrence of a crystal defect or crack in the epitaxially grown layer 3 can be suppressed. Even if the thickness of the epitaxially grown layer 3 is reduced to 5 $\mu$m or less, therefore, the epitaxially grown layer 3 and the sapphire substrate 1 can be separated from each other, while the epitaxially grown layer 3 retains its excellent crystalline property. Since the thickness of the epitaxially grown layer 3 is as thin as about 5 $\mu$m, it is possible to reduce the bowing of the substrate resulting from the different thermal expansion coefficients of the epitaxially grown layer 3 and the sapphire substrate 1 during the cooling of the substrate after epitaxial growth. This allows easy, uniform, and highly reproducible adhesion to the flat Si substrate 4 performed by using, e.g., metal. That is, the same effects as achieved by the first, second, and third embodiments are achievable.

Since the band gap difference (0.39 eV) between the $In_{0.1}Ga_{0.9}N$ layer 5 and the GaN layer is larger than the band gap difference (0.12 eV) between the ZnO layer 2 and the GaN layer in the first embodiment, the present embodiment performs separation at a temperature lower than in the first embodiment and more effectively suppresses the occurrence of a crystal defect, the bowing of the substrate, and the like than the first embodiment.

Since the present embodiment is provided with the AlN buffer layer 6 which is a buffer layer for reducing distortion resulting from a lattice mismatch between the sapphire substrate 1 and the $In_{0.1}Ga_{0.9}N$ layer 5 as the spacer layer, the distortion resulting from the lattice mismatch therebetween is reduced and the crystalline properties of the $In_{0.1}Ga_{0.9}N$ layer 5 and the epitaxially grown layer 3 are improved compared with the case where the $In_{0.1}Ga_{0.9}N$ layer 5 is formed directly on the sapphire substrate 1. Compared with the first to third embodiments, therefore, the present embodiment further improves the property (which is, e.g., a luminous intensity or an operating current in a semiconductor laser) of a device formed by using the epitaxially grown layer 3.

Variation

Figure 19:
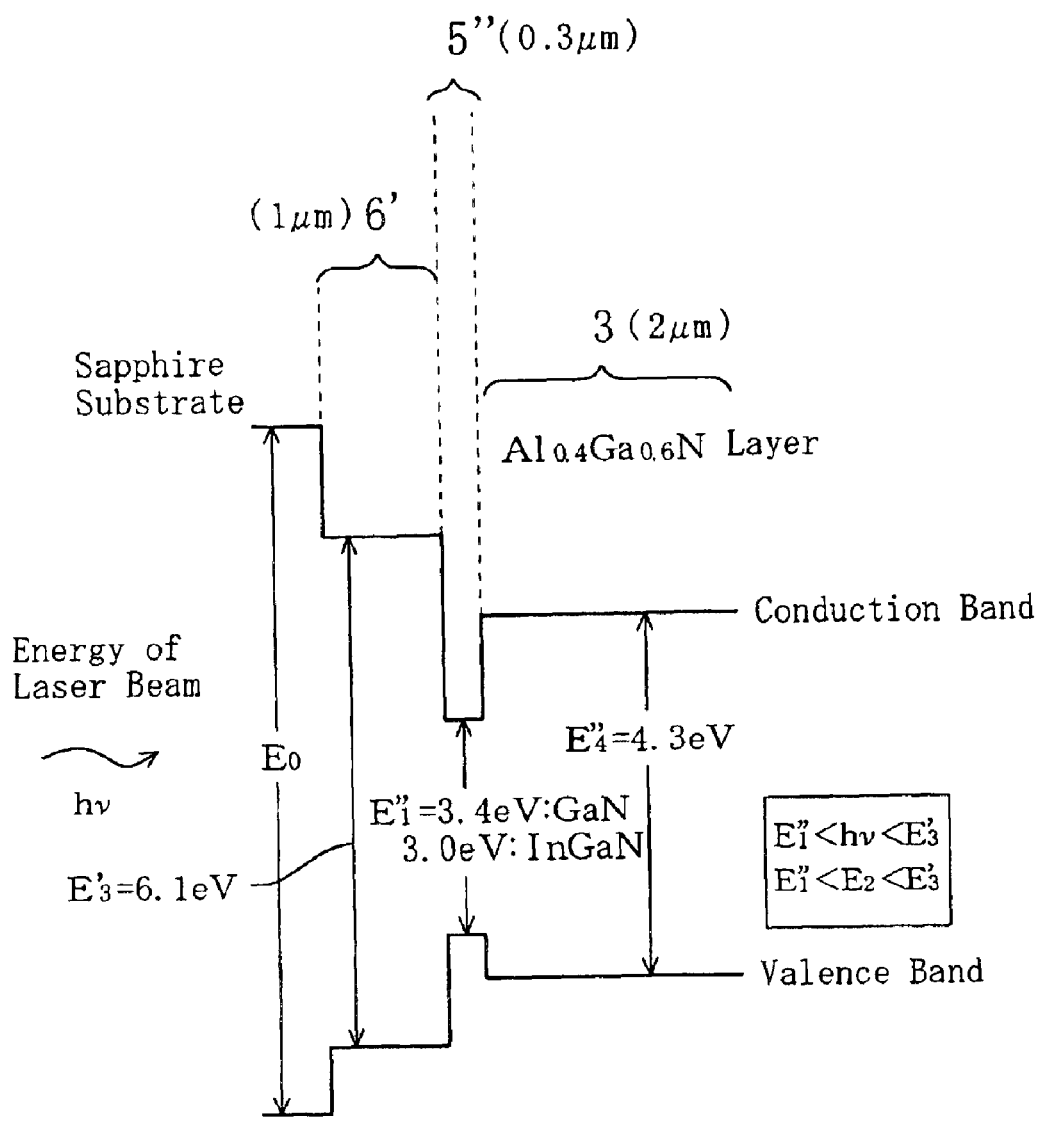
FIG. 19 is an energy band diagram showing respective band structures in a sapphire substrate, an epitaxially grown layer, and the like according to a variation of the fourth embodiment.

FIG. 19 is an energy band diagram showing respective band structures in a sapphire substrate, an epitaxially grown layer, and the like according to a variation of the fourth embodiment.

In the variation, an AlN buffer layer 6' with a thickness of 1 $\mu$m is formed in place of the AlN buffer layer 6 with a thickness of about 30 nm. On the other hand, a spacer layer 5'' composed of an $In_{0.1}Ga_{0.9}N$ layer or a GaN layer having a thickness of 0.3 $\mu$m is formed on the AlN buffer layer 6' in place of the $In_{0.1}Ga_{0.9}N$ layer 5 with a thickness of about 30 nm. The basic structure of the epitaxially grown layer 3 is a multilayer structure including a GaN layer, an AlGaN layer, and an InGaN layer, each of which is of p-type, of n-type, or undoped, and having a thickness of 1 $\mu$m in the same manner as in the fourth embodiment. The thickness of the epitaxially grown layer 3 is 2 $\mu$m. In the present variation, an $Al_{0.4}Ga_{0.6}N$ layer is formed in direct contact with the spacer layer 5''.

In the present variation, the band gap E1'' of the spacer layer 5'' is 3.4 eV or 3.0 eV, which is smaller than the band gap E4' (4.3 eV) of the $Al_{0.4}Ga_{0.6}N$ layer and the band gap E3' (6.1 eV) of the AlN buffer layer 6'. The energy h v of the laser beam used for peeling is larger than the band gap E1'' of the spacer layer 5'' and smaller than the band gap E3' of the AlN buffer layer 6'. Accordingly, the present variation can achieve the same effects as achieved by the fourth embodiment.

In addition to the effects achieved by the fourth embodiment, the present variation also achieves the following effects. That is, the present variation can reduce the total thickness (which is 2.3 $\mu$m in the present variation even if the spacer layer 5'' is regarded as a part of the epitaxially grown layer) of the epitaxially grown layer 3 to a value smaller than 4 $\mu$m, similarly to the variation of the third embodiment. Consequently, the bowing of the entire wafer resulting from the different thermal expansion coefficients of the sapphire substrate and the epitaxially grown layer (nitride semiconductor layer) can be suppressed so that a flat recipient substrate is adhered to the wafer. By thus increasing the thickness of the AlN buffer layer 6' from conventional 50 nm to 1 µm, the crystalline property of the epitaxially grown layer can be improved. In contrast to the dislocation density of the epitaxially grown layer (nitride semiconductor layer) which is about $10^9/cm^2$ in the structure according to the fourth embodiment, the dislocation density of the epitaxially grown layer (nitride semiconductor layer) in the present variation is about $10^8/cm^2$, so that a dislocation density lower by one order of magnitude is achieved. To positively achieve such a crystalline-property improving effect, the thickness of the AlN buffer layer 6' is preferably 1 µm or more.

Embodiment 5

FIGS. 11A to 11D are cross-sectional views illustrating a method for fabricating a semiconductor device according to a fifth embodiment of the present invention.

Figure 11A:
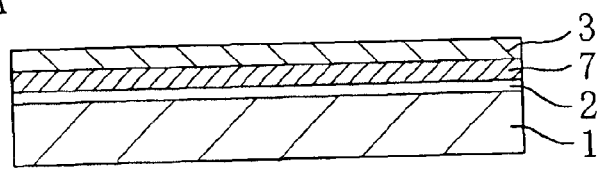
FIGS. 11A to 11D are cross-sectional views illustrating a method for fabricating a semiconductor device according to a fifth embodiment of the present invention.

First, in the step shown in FIG. 11A, a sapphire substrate 1 (wafer) having a principal surface substantially coincident with the (0001) plane (c plane) is prepared. Then, a ZnO layer 2 with a thickness of about 100 nm serving as a spacer layer is formed on the sapphire substrate 1 by, e.g., RF sputtering. Thereafter, an AlGaN multilayer portion 7 composed of five $Al_{0.05}Ga_{0.95}N$ layers each having a thickness of about 30 nm and five $Al_{0.1}Ga_{0.9}N$ layers each having a thickness of about 30 nm, which are alternately stacked, is formed by MOCVD on the ZnO layer 2. Subsequently, an epitaxially grown layer 3 (with a thickness of 5 µm) having a multilayer structure including a GaN layer, an AlGaN layer, and an InGaN layer, each of which is of p-type, of n-type, or undoped, is formed by MOCVD on the AlGaN multilayer portion 7. In the present embodiment, the GaN layer included in the epitaxially grown layer 3 is formed in direct contact with the AlGaN multilayer portion 7. In the case of fabricating a semiconductor laser, a waveguide structure has been incorporated into the epitaxial layer 3 by using a regrowth technique, selective etching or the like.

Figure 11B:
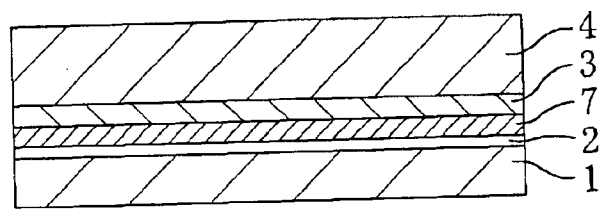
Figure 11C:
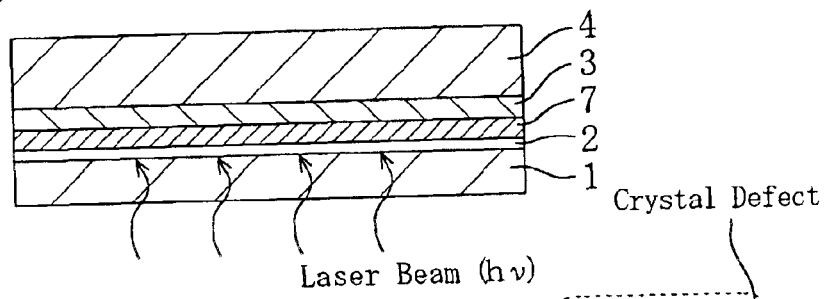

Next, in the step shown in FIG. 11B, the epitaxially grown layer 3 is adhered to an Si substrate 4 (recipient substrate) having a principal surface substantially coincident with the (001) plane. In the step shown in FIG. 11C, the back surface of the sapphire substrate 1 is irradiated with the third-harmonic (at a wavelength of 355 nm corresponding to an energy of 3.49 eV) of a YAG laser, whereby the sapphire substrate 1 and the epitaxially grown layer 3 are separated from each other. The irradiation is performed such that the beam (luminous flux) of the laser scans the entire surface of the wafer. The entire wafer has been heated to about 500° C. such that an in-film stress resulting from the different thermal expansion coefficients of the sapphire substrate 1, the ZnO layer 2, the multilayer portion 7, and the epitaxially grown layer 3 are reduced. The heating temperature is preferably in the range of 400° C. to 750° C. in terms of performing the stress reducing function without inducing the degradation of the properties of the individual layers on the substrate and the significant deformation thereof.

In the case of fabricating the semiconductor laser, the epitaxially grown layer 3 and the Si substrate 4 are adhered to each other such that the <11-20> direction of the GaN layer and the <110> direction of the Si substrate are in parallel relation for easy cleavage.

The optical density (at a wavelength of 355 nm) of the third harmonic of the YAG laser is preferably 200 mJ/cm² or more.

The time at which the Si substrate 4 is adhered to the epitaxially grown layer 3 may be prior to the irradiation with the laser beam, as in the present embodiment, or after the separation of the sapphire substrate 1 with the irradiation with the laser beam.

Figure 11D:
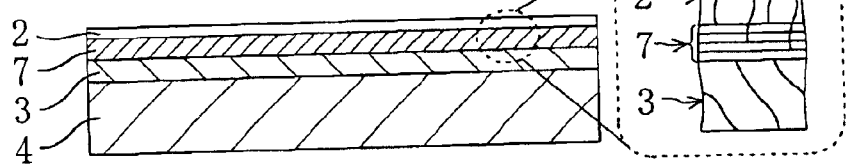

Consequently, the sapphire substrate 1 and the epitaxially grown layer 3 are separated from each other, as shown in FIG. 11D. Thereafter, the process of forming an electrode which comes in contact with the epitaxially grown layer 3 on the Si substrate 4, cleaving the substrate (in the case of fabricating the semiconductor laser), and the like is performed.

In the present embodiment, a structure provided with the AlGaN multilayer portion 7 in place of the ZnO layer 2 of the structure shown in, e.g., each of FIGS. 2 and 3 is obtained in the steps shown in FIGS. 11A and 11D.

Figure 12:
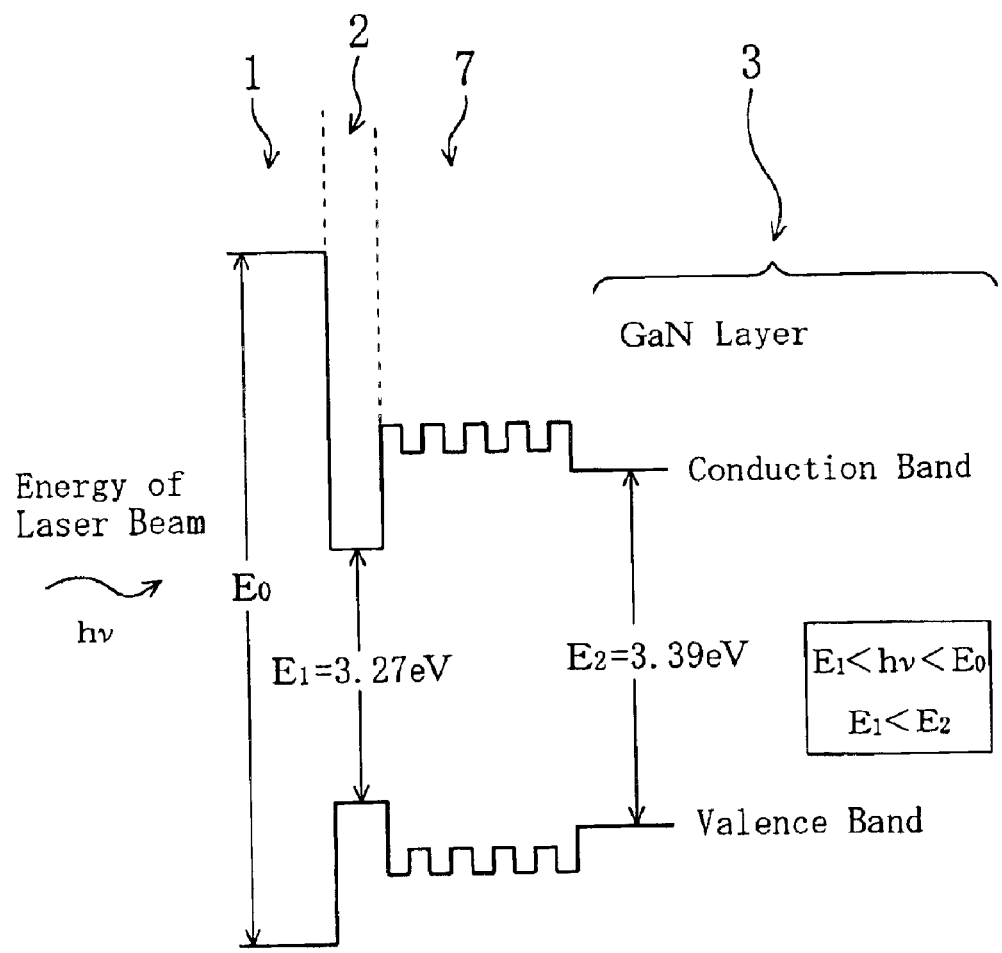
FIG. 12 is an energy band diagram showing respective band structures in a sapphire substrate, a ZnO layer, an AlGaN multilayer portion, and a GaN layer in an epitaxially grown layer according to the fifth embodiment.

FIG. 12 is an energy band diagram showing respective band structures in the sapphire substrate 1, the ZnO layer 2, the AlGaN multilayer portion 7, and the GaN layer included in the epitaxially grown layer 3 according to the present embodiment.

In the present embodiment also, the laser beam used to irradiate the back surface of the wafer is primarily absorbed by the ZnO layer 2 so that it hardly reaches the AlGaN multilayer portion 7 and the epitaxially grown layer 3. Consequently, the decomposition or fusion of the crystal occurs in the entire ZnO layer 2 or in the region of the ZnO layer 2 adjacent the interface with the sapphire substrate 1. This allows the epitaxially grown layer 3 and the sapphire substrate 1 to be separated from each other at a low light power density. Since the epitaxially grown layer 3 is hardly fused, the occurrence of a crystal defect or crack in the epitaxially grown layer 3 can be suppressed. Since the thickness of the epitaxially grown layer 3 is as thin as about 5 µm, it is possible to reduce the bowing of the substrate resulting from the different thermal expansion coefficients of the epitaxially grown layer 3 and the sapphire substrate 1 during the cooling of the substrate after epitaxial growth. This allows easy, uniform, and highly reproducible adhesion to a flat Si substrate 4 performed by using, e.g., metal.

In addition, a crystal defect or a crack caused in the ZnO layer 2 by the laser beam used for irradiation is terminated at the interfaces between the individual layers of the AlGaN multilayer portion 7 composed of the five $Al_{0.05}Ga_{0.95}N$ layers and the five $Al_{0.1}Ga_{0.9}N$ layers which are alternately stacked, as shown in the enlarged view of FIG. 11D. This more effectively prevents the extension of the crystal defect or crack to the epitaxially grown layer 3 and improves the crystalline property of the epitaxially grown layer 3. Compared with the first to third embodiments, therefore, the present embodiment can further improve the property (which is, e.g., a luminous intensity or an operating current in a semiconductor laser) of a device formed by using the epitaxially grown layer 3.

The multilayer portion 7 need not necessarily be composed of two thin films having different compositions as in the present embodiment. The multilayer portion 7 may be formed by alternately stacking three or more thin films in layers or may be composed of a plurality of thin films having different compositions. This is because, if the thin films formed one after another have gradually varying compositions, the extension of a crystal defect or a crack is prevented at the boundaries between the formed thin films.

In the case of providing the multilayer portion 7, the epitaxially grown layer need not necessarily be separated from the substrate with the irradiation with the laser beam.

It is also possible to use an epitaxially grown layer grown epitaxially on the substrate as it is. In that case, the spacer layer such as the ZnO layer 2 need not necessarily be provided. Since crystal defects or cracks in the epitaxially grown layer is reduced by the formation of the epitaxially grown layer on the multilayer portion 7 compared with those in the conventional device, the present embodiment achieves the effect of improving the property (which is, e.g., a luminous intensity or an operating current in a semiconductor laser) of a device formed by using the epitaxially grown layer 3.

Variation

Figure 13:
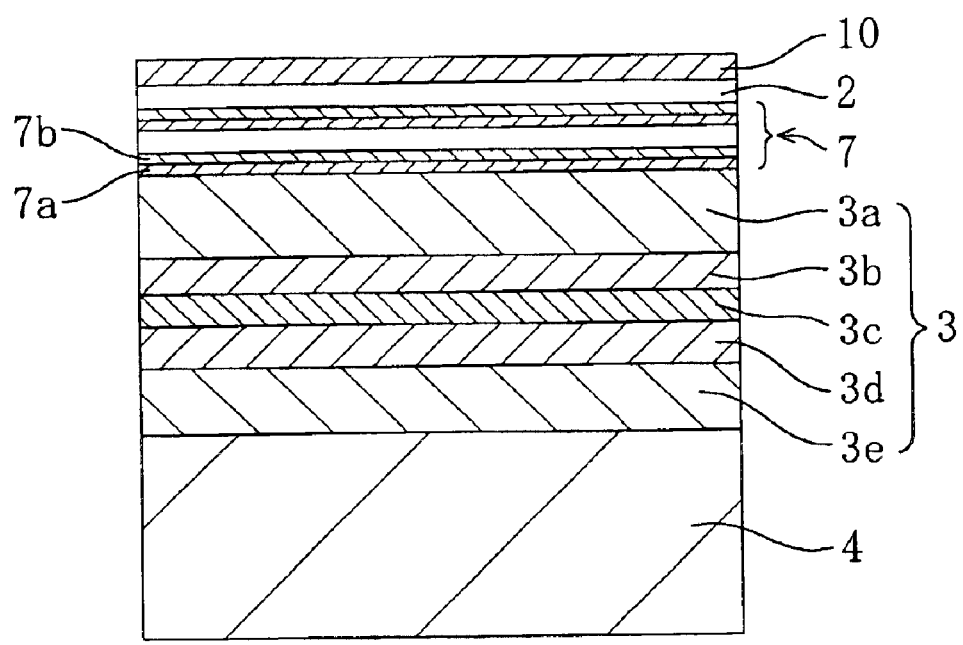
FIG. 13 is a cross-sectional view showing a variation of the fifth embodiment in which an AlGaN multilayer portion is formed to have a multiple quantum well structure.

The GaN multilayer portion 7 may also be formed to have a multiple quantum well structure. FIG. 13 is a cross-sectional view showing a variation of the present embodiment in which the AlGaN multilayer portion 7 is formed to have a multiple quantum well structure. As shown in FIG. 13, the epitaxially grown layer 3 has been separated from the sapphire substrate and mounted on an Si substrate 4. The multilayer portion 7, the ZnO layer 2, and an n-type electrode 10 are provided successively on the epitaxially grown layer 3. The structure is obtained after the epitaxially grown layer 3 and the multilayer portion 7 were separated from the sapphire substrate and bowinged onto the Si substrate. However, a method for separating the epitaxially grown layer 3 and the multilayer portion 7 from the sapphire substrate is not limited to the method used in the present embodiment. The ZnO layer 2 serving as the spacer layer need not necessarily be provided. In a semiconductor laser, the epitaxially grown layer 3 has a structure as shown in FIG. 3.

In this variation, the AlGaN multilayer portion 7 has a structure obtained by alternately stacking five $Al_{0.05}Ga_{0.95}N$ layers 7a each heavily doped with a p-type impurity and having a thickness of about 2 nm and five undoped $Al_{0.1}Ga_{0.9}N$ layers 7b each having a thickness of about 10 nm. By thus adopting a structure in which each of the plurality of heavily doped quantum wells is interposed between the undoped layers, a low-resistance p-type region can be formed, while defective regions are reduced. Even if a large number of crystal defects and cracks are present in a bulk single-crystal substrate, therefore, the extension of the crystal defects and cracks in the single-crystal substrate to the semiconductor layer is prevented in the multilayer portion so that the semiconductor layer with an excellent crystalline property is obtainable. Since the efficiency with which carries are supplied to the epitaxially grown layer 3 is increased, the property of a device (which is, e.g., a luminous intensity or an operating current in a semiconductor laser) can be increased, while the DC series resistance is reduced.

Embodiment 6

FIGS. 14A to 14D are cross-sectional views illustrating a method for fabricating a semiconductor device according to a sixth embodiment of the present invention.

Figure 14A:
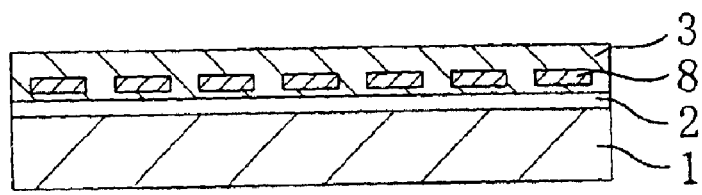
FIGS. 14A to 14D are cross-sectional views illustrating a method for fabricating a semiconductor device according to a sixth embodiment of the present invention.

First, in the step shown in FIG. 14A, a sapphire substrate 1 (wafer) having a principal surface substantially coincident with the (0001) plane (c plane) is prepared. Then, an epitaxially grown layer 3 having a multilayer structure including a GaN layer, an AlGaN layer, and an InGaN layer, each of which is of p-type, of n-type, or undoped, is formed on the ZnO layer 2. Subsequently, covering portions 8 each composed of a tungsten layer or an $SiO_2/TiO_2$ multilayer film having a thickness of about 100 nm are formed within the epitaxially grown layer 3. Specifically, after a GaN layer with a thickness of, e.g., about 1 μm is formed on the ZnO layer 2, the tungsten film or $SiO_2/TiO_2$ multilayer film is formed by, e.g., RF sputtering on the GaN layer. The tungsten film or $SiO_2/TiO_2$ multilayer film is patterned by, e.g., reactive ion etching to form the striped covering portions 8 arranged in stripes each having a width of about 5 μm with 10-μm spaces provided therebetween. Instead of the striped covering portions 8, dotted (island-like) covering portions may also be provided. Subsequently, the GaN layer, the AlGaN layer, and the InGaN layer are grown epitaxially by, e.g., MOCVD from the portions of the GaN layer located in the spaces between the stripes of the covering portions 8, whereby the epitaxially grown layer 3 having a multilayer structure with the total thickness of about 6 μm is formed. In the present embodiment, the GaN layer included in the epitaxially grown layer 3 is formed in direct contact with the ZnO layer 2. In the case of forming a semiconductor laser, a waveguide structure has been incorporated into the epitaxial layer 3 by using a regrowth technique, selective etching or the like.

It is also possible to form the covering portions 8 directly on the ZnO layer 2 serving as the spacer layer and then growing the epitaxially grown layer 3 from the portions of the ZnO layer located in the spaces between the stripes of the covering portions 8.

Figure 14B:
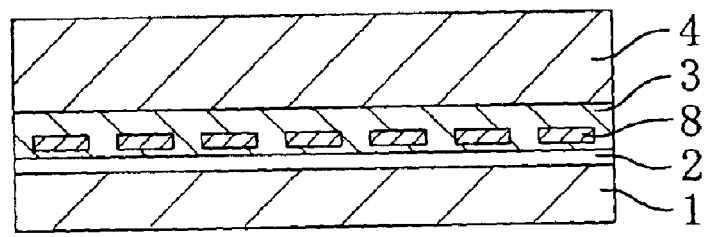
Figure 14C:
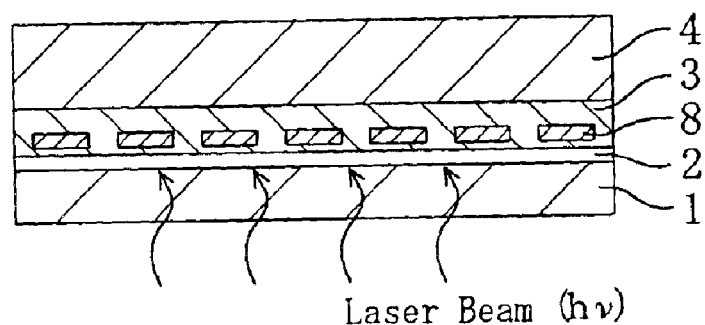

Next, in the step shown in FIG. 14B, the epitaxially grown layer 3 is adhered to an Si substrate 4 (recipient substrate) having a principal surface substantially coincident with the (001) plane. In the step shown in FIG. 14C, the back surface of the sapphire substrate 1 is irradiated with a KrF excimer laser (at a wavelength of 248 nm), whereby the sapphire substrate 1 and the epitaxially grown layer 3 are separated from each other. The irradiation is performed such that the beam (luminous flux) of the laser scans the entire surface of the wafer. The entire wafer has been heated to about 500° C. such that an in-film stress resulting from the different thermal expansion coefficients of the sapphire substrate 1, the ZnO layer 2, the multilayer portion 7, and the epitaxially grown layer 3 are reduced. The heating temperature is preferably in the range of 400° C. to 750° C. in terms of performing the stress reducing function without inducing the degradation of the properties of the individual layers on the substrate and the significant deformation thereof.

In the case of fabricating the semiconductor laser, the epitaxially grown layer 3 and the Si substrate 4 are adhered to each other such that the <11-20> direction of the GaN layer and the <110> direction of the Si substrate are in parallel relation for easy cleavage.

The time at which the Si substrate 4 is adhered to the epitaxially grown layer 3 may be prior to the irradiation with the laser beam, as in the present embodiment, or after the separation of the sapphire substrate 1 with the irradiation with the laser beam.

The optical density of the KrF excimer laser is preferably 600 mJ/cm$^2$ or more.

Figure 14D:
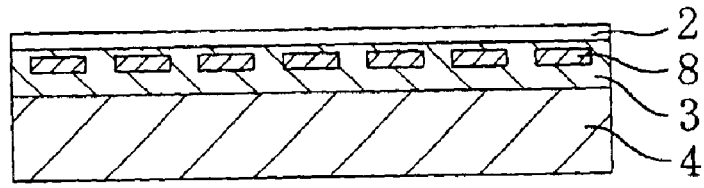

Consequently, the sapphire substrate 1 and the epitaxially grown layer 3 are separated from each other, as shown in FIG. 14D. Thereafter, the process of forming an electrode which comes in contact with the epitaxially grown layer 3 on the Si substrate 4, cleaving the substrate (in the case of fabricating the semiconductor laser), and the like is performed.

Figure 15:
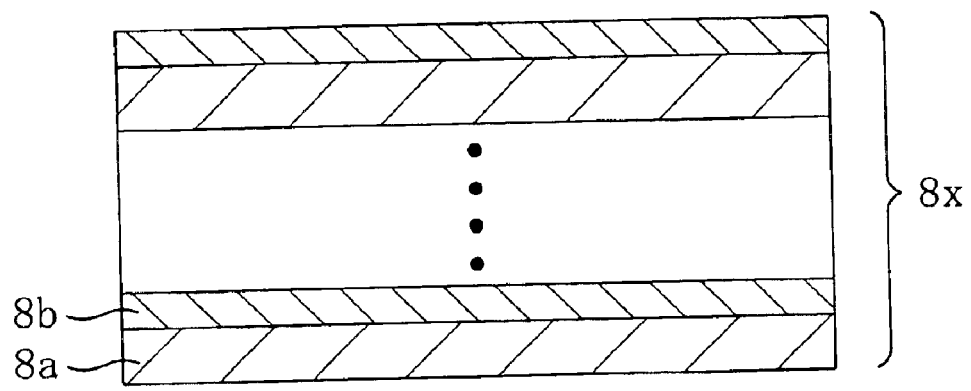
FIG. 15 is a cross-sectional view showing an exemplary structure of an $SiO_2/TiO_2$ multilayer film according to the sixth embodiment.

FIG. 15 is a cross-sectional view showing an exemplary structure of an $SiO_2/TiO_2$ multilayer film 8x. As shown in FIG. 15, the $SiO_2/TiO_2$ multilayer film 8x is composed of four $SiO_2$ films 8a having a thickness of 59.7 nm and four $TiO_2$ films 8b having a thickness of 59.7 nm which are alternately stacked in layers. The structure achieves a high reflectivity of 99.5% against a UV light beam at 355 nm (e.g., the third harmonic of a YAG laser).

In the present embodiment also, the laser beam used to irradiate the back surface of the wafer is primarily absorbed by the ZnO layer 2 so that it hardly reaches the AlGaN multilayer portion 7 and the epitaxially grown layer 3. Consequently, the decomposition or fusion of the crystal occurs in the entire ZnO layer 2 or in the region of the ZnO layer 2 adjacent the interface with the sapphire substrate 1. This allows the epitaxially grown layer 3 and the sapphire substrate 1 to be separated from each other at a low light power density. Since the thickness of the epitaxially grown layer 3 is as thin as about 5 μm, it is possible to reduce the bowing of the substrate resulting from the different thermal expansion coefficients of the epitaxially grown layer 3 and the sapphire substrate 1 during the cooling of the substrate after epitaxial growth. This allows easy, uniform, and highly reproducible adhesion to a flat Si substrate 4 performed by using, e.g., metal.

In addition, the fabrication method according to the present embodiment has formed the covering portions 8 composed of the tungsten film or $SiO_2/TiO_2$ multilayer film within the epitaxially grown layer 3 corresponding to the nitride semiconductor layer according to the first embodiment. If a tungsten layer is inserted as the covering portions 8, the laser beam is reflected by the tungsten layer and confined in the portions of the GaN layer and ZnO layer located under the tungsten layer, which allows the separation of the sapphire substrate 1 and the epitaxially grown layer 3 at a lower power density. If the $SiO_2/TiO_2$ multilayer film is used as the covering portions 8, the reflectivity against the laser beam can also be increased by adjusting the film thicknesses of the $SiO_2$ film and the $TiO_2$ film so that the same effects as achieved by the tungsten film are achievable.

If the $SiO_2/TiO_2$ multilayer film is used as the covering portions 8, in particular, the thermal conductivity thereof is lower than that of the GaN layer so that the function of confining heat raised by the laser beam in the separating step is enhanced. This allows the separation of the sapphire substrate 1 and the epitaxially grown layer 3 at a lower power density.

Moreover, the present embodiment has formed the GaN layer, the AlGaN layer, and the InGaN layer from the GaN layer as the underlie after the formation of the covering portions 8. In that case, if the epitaxially grown crystal layer grows through the spaces between the stripes of the covering portions 8, the epitaxially grown layer 3 is formed by upward crystal growth as well as lateral crystal growth along the upper surfaces of the covering portions 8. In such a structure, even if a crystal defect and a crack occur in the GaN layer in contact with the ZnO layer 2 after crystal growth and extend to the crystal layer growing upwardly of the GaN layer, it has been proved that they seldom extend to the laterally growing crystal layer. As a consequence, the portions of the epitaxially grown layer 3 overlying the covering portions 8 are hardly affected by the underlie so that the crystal defect and crack extended from the underlie are seldom observed therein. This indicates that the fabrication method according to the present embodiment allows the epitaxial growth of a crystal with a particularly excellent crystalline property.

Thus, the fabrication method according to the present embodiment allows the separation of the sapphire substrate 1 and the epitaxially grown layer 3 at a light power density of the laser beam lower than in the first embodiment and further reduces crystal defects and cracks in the epitaxially grown layer 3.

Embodiment 7

Figure 20:
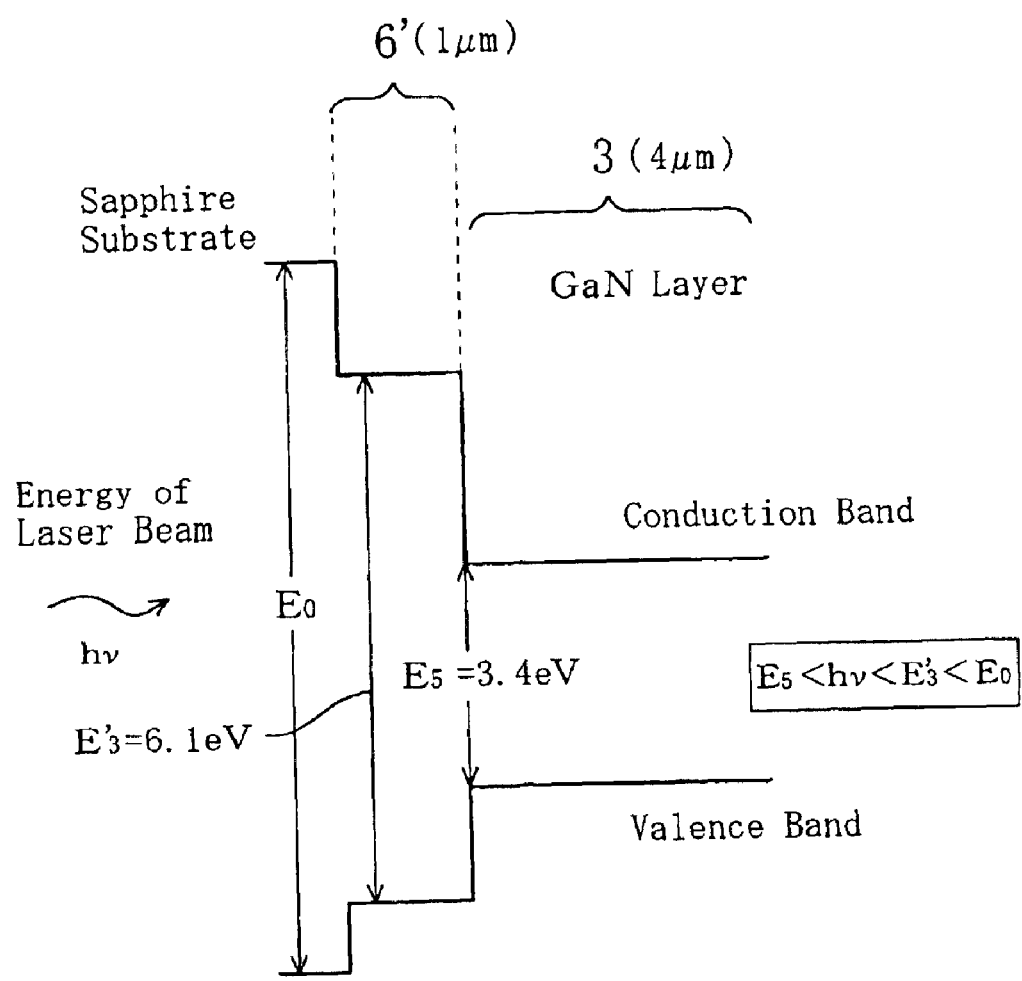
FIG. 20 is an energy band diagram showing respective band structures in a sapphire substrate, an epitaxially grown layer, and the like according to a variation of a seventh embodiment of the present invention.

FIG. 20 is an energy band diagram showing respective band structures in a sapphire substrate, an epitaxially grown layer, and the like according to a seventh embodiment of the present invention.

In the present embodiment, an AlN buffer layer 6' with a thickness of 1 μm is formed instead of the AlN buffer layer 6 with a thickness of about 30 nm according to the fourth embodiment. Instead of the spacer layer 5" composed of the $In_{0.1}Ga_{0.9}N$ layer or the GaN layer provided in the fourth embodiment, an epitaxially grown layer 3 including a thick GaN layer is formed on the AlN buffer layer 6'. The basic structure of the epitaxially grown layer 3 has a multilayer structure including a GaN layer, an AlGaN layer, and an InGaN layer, each of which is of p-type, of n-type, or undoped in the same manner as in the fourth embodiment. The thickness of the epitaxially grown layer 3 is 4 μm. In the present embodiment, the GaN layer is formed in direct contact with the AlN buffer layer 6'.

In the present embodiment, the band gap E5 of the GaN layer included in the epitaxially grown layer 3 is 3.4 eV, which is smaller than the band gap E3' (6.1 eV) of the AlN buffer layer 6'. The energy h ν of the laser beam used for peeling is larger than the band gap E5 (3.4 eV) of the GaN layer and smaller than the band gap E3' (6.1 eV) of the AlN buffer layer 6'.

By thus increasing the thickness of the AlN buffer layer 6' from conventional 50 nm to 1 μm, the present embodiment can improve the crystalline property of the epitaxially grown layer, similarly to the variation of the fourth embodiment. In contrast to the dislocation density of the epitaxially grown layer (nitride semiconductor layer) which is about $10^9/cm^2$ in the structure according to the fourth embodiment, the dislocation density of the epitaxially grown layer (nitride semiconductor layer) in the present variation is about $10^8/cm^2$, so that a dislocation density lower by one order of magnitude is achieved. To positively achieve such a crystalline-property improving effect, the thickness of the AlN buffer layer 6' is preferably 1 μm or more.

Other Embodiments

The structure formed in accordance with the method for fabricating a semiconductor device and the process thereof according to each of the foregoing embodiments and the variations thereof achieves particularly prominent effects if it is applied to a semiconductor device having a group III–V compound semiconductor layer. The types of the semiconductor device to which the structure according to the present invention is applicable include a light-emitting diode, a semiconductor laser, and a semiconductor device other than the semiconductor laser such as a MESFET, HEMT, or a Schottky diode.

In the present invention, a substrate (single-crystal substrate) serving as the underlie for each of the epitaxially grown layers is not limited to the sapphire substrate. It is also possible to use an SiC substrate, an MgO substrate, an $LiGaO_2$ substrate, an $LiGa_xAl_{1-x}O_2$ ($0 \leq x \leq 1$) mixed crystal substrate, or the like. The use of the sapphire substrate improves the initial growth of a group III–V compound and allows a group III–V compound semiconductor layer containing nitrogen and having an excellent crystalline property to be formed thereon. The use of the SiC substrate, the MgO substrate, the $LiGaO_2$ substrate, or the $LiGa_xAl_{1-x}O_2$ ($0 \leq x \leq 1$) mixed crystal substrate brings the lattice constant of the single-crystal substrate closer to that of the group III–V compound semiconductor layer and allows the semiconductor layer composed of a group III–V compound, containing nitrogen, and having an excellent crystalline property to be formed thereon.

Although the present invention has bowinged the epitaxially grown layer separated from the sapphire substrate onto the Si substrate (recipient substrate), it is also possible to use a GaAs substrate, a GaP substrate, an InP substrate, or the like as the recipient substrate in place of the Si substrate. This is because an excellent cleavage plane can easily be obtained by using such a single-crystal substrate.

Although each of the foregoing embodiments has transferred the epitaxially grown layer separated from the sapphire substrate onto the Si substrate, it is also possible to use the separated epitaxially grown layer as it is without mounting it on another substrate.

What is claimed is:

1. A method for fabricating a semiconductor device having a semiconductor layer formed by epitaxial growth from a single-crystal substrate, the method comprising the steps of:

(a) forming a spacer layer having an optical band gap smaller than an optical band gap of a lowermost portion of the semiconductor layer such that an upper surface of the single-crystal substrate is covered with the spacer layer;

(b) forming the semiconductor layer on the spacer layer; and (c) irradiating the spacer layer with a light beam having an energy smaller than an optical band gap of the single-crystal substrate and larger than the optical band gap of the spacer layer through a back surface of the single-crystal substrate to separate the semiconductor layer from the single-crystal substrate, wherein the step (b) includes forming a group III–V compound semiconductor layer as the semiconductor layer, wherein the step (a) includes forming a ZnO layer as the spacer layer and the step (b) includes composing the lowermost portion of the semiconductor layer of a group III–V compound material containing nitrogen and having an optical band gap larger than an optical band gap of the ZnO layer.

2. A method for fabricating a semiconductor device having a semiconductor layer formed by epitaxial growth from a single-crystal substrate, the method comprising the steps of:

(a) forming a spacer layer having an optical band gap smaller than an optical band gap of a lowermost portion of the semiconductor layer such that an upper surface of the single-crystal substrate is covered with the spacer layer;

(b) forming the semiconductor layer on the spacer layer; and (c) irradiating the spacer layer with a light beam having an energy smaller than an optical band gap of the single-crystal substrate and larger than the optical band gap of the spacer layer through a back surface of the single-crystal substrate to separate the semiconductor layer from the single-crystal substrate, wherein the step (a) includes forming, as the spacer layer, a group III–V compound semiconductor layer containing nitrogen and the step (b) includes composing the lowermost portion of the semiconductor layer of a group III–V compound semiconductor layer containing nitrogen and having an optical band gap larger than the optical band gap of the spacer layer, wherein the step (a) includes forming a GaN layer as the spacer layer and the step (b) includes composing the lowermost portion of the semiconductor layer of an $Al_yGa_{1-y}N$ layer ($0<y\leq 1$), and wherein the step (b) includes adjusting a thickness of the semiconductor layer to a range not less than 0.5 $\mu$m and less than 4 $\mu$m.

3. A method for fabricating a semiconductor device having a semiconductor layer formed by epitaxial growth from a single-crystal substrate, the method comprising the steps of:

(a) forming a spacer layer having an optical band gap smaller than an optical band gap of a lowermost portion of the semiconductor layer such that an upper surface of the single-crystal substrate is covered with the spacer layer;

(b) forming the semiconductor layer on the spacer layer; and (c) irradiating the spacer layer with a light beam having an energy smaller than an optical band gap of the single-crystal substrate and larger than the optical band gap of the spacer layer through a back surface of the single-crystal substrate to separate the semiconductor layer from the single-crystal substrate, said method further comprising, after the step (a) and prior to the step (b), the step of:

forming, on the spacer layer, a multilayer portion composed of a plurality of thin films stacked in layers to have gradually varying compositions, wherein the step (b) includes forming the semiconductor layer on the multilayer portion.

4. The method of claim 3, wherein the multilayer portion is a multiple quantum well layer composed of alternately stacked quantum well layers and barrier layers.

5. A method for fabricating a semiconductor device having a semiconductor layer formed by epitaxial growth from a single-crystal substrate, the method comprising the steps of:

(a) forming a spacer layer having an optical band gap smaller than an optical band gap of a lowermost portion of the semiconductor layer such that an upper surface of the single-crystal substrate is covered with the spacer layer;

(b) forming the semiconductor layer on the spacer layer; and (c) irradiating the spacer layer with a light beam having an energy smaller than an optical band gap of the single-crystal substrate and larger than the optical band gap of the spacer layer through a back surface of the single-crystal substrate to separate the semiconductor layer from the single-crystal substrate, wherein the step (b) includes the substeps of:

(b1) forming a plurality of covering portions covering the spacer layer in mutually spaced apart relation; and (b2) forming the semiconductor layer such that the spacer layer and the plurality of covering portions are covered with the semiconductor layer.

6. The method of claim 5, wherein the substep (b2) includes the steps of:

prior to the substep (b1), forming, in a part of the semiconductor layer covering the spacer layer, the plurality of covering portions in mutually spaced apart relation; and after the substep (b1), forming a remaining part of the semiconductor layer through a space between the covering portions.

7. The method of claim 5, wherein the substep (b1) includes forming the covering portions composed of a multilayer insulating film or a metal film.

8. The method of claim 5, wherein the substep (b1) includes forming the covering portions composed of a material lower in thermal conductivity than the spacer layer.

9. A method for fabricating a semiconductor device having a semiconductor layer formed by epitaxial growth from a single-crystal substrate, the method comprising the steps of:
- (a) forming a spacer layer having an optical band gap smaller than an optical band gap of a lowermost portion of the semiconductor layer such that an upper surface of the single-crystal substrate is covered with the spacer layer;
- (b) forming the semiconductor layer on the spacer layer; and
- (c) irradiating the spacer layer with a light beam having an energy smaller than an optical band gap of the single-crystal substrate and larger than the optical band gap of the spacer layer through a back surface of the single-crystal substrate to separate the semiconductor layer from the single-crystal substrate, said method further comprising, prior to the step (a), the step of:

forming, on the single-crystal substrate, a buffer layer having an optical band gap larger than the energy of the light beam used for the irradiation in the step (c) such that the buffer layer reduces distortion resulting from a lattice mismatch between the spacer layer and the single-crystal substrate in the step (c), wherein the step (a) includes forming the spacer layer on the buffer layer.

10. The method of claim 9, wherein the step of forming the buffer layer includes forming, as the buffer layer, an AlN buffer layer having a thickness in the range of 0.5 $\mu$m to 2 $\mu$m.

11. A method for fabricating a semiconductor device having a semiconductor layer formed by epitaxial growth from a single-crystal substrate, the method comprising the steps of:
- (a) forming a spacer layer having an optical band gap smaller than an optical band gap of a lowermost portion of the semiconductor layer such that an upper surface of the single-crystal substrate is covered with the spacer layer;
- (b) forming the semiconductor layer on the spacer layer; and
- (c) irradiating the spacer layer with a light beam having an energy smaller than an optical band gap of the single-crystal substrate and larger than the optical band gap of the spacer layer through a back surface of the single-crystal substrate to separate the semiconductor layer from the single-crystal substrate, said method further comprising, prior to the step (a), the step of:

forming, on the single-crystal substrate, an AlN buffer layer having a thickness of 0.5 $\mu$m or more, wherein the step (a) includes forming an $In_xGa_{1-x}N$ layer ($0<x\leq1$) or a GaN layer as the spacer layer and the step (b) includes forming the semiconductor layer on the spacer layer such that the lowermost portion of the semiconductor layer is composed of an $Al_yGa_{1-y}N$ layer ($0<y\leq1$).

12. A method for fabricating a semiconductor device, the method comprising the steps of:
- (a) forming an AlN buffer layer having a thickness of 0.5 $\mu$m or more on a single-crystal substrate;
- (b) forming a semiconductor layer covering the AlN buffer layer and having a lowermost portion composed of an $Al_yGa_{1-y}N$ layer ($0\leq y\leq1$); and
- (c) irradiating the semiconductor layer with a light beam having an energy smaller than an optical band gap of the AlN buffer layer and larger than an optical band gap of the lowermost portion of the semiconductor layer through a back surface of the single-crystal substrate to separate the semiconductor layer from the single-crystal substrate.

* * * * *